United States Patent [19]

Hatanaka et al.

[11] 4,390,791

[45] Jun. 28, 1983

[54] SOLID-STATE PHOTOELECTRIC TRANSDUCER

[75] Inventors: Katsunori Hatanaka, Yokohama; Shunichi Uzawa; Yutaka Hirai, both of Tokyo; Naoki Ayata, Machida, all of Japan

[73] Assignee: Canon Kabushiki Kaisha, Tokyo, Japan

[21] Appl. No.: 247,752

[22] Filed: Mar. 26, 1981

[30] Foreign Application Priority Data

| Mar. 31, 1980 [JP] | Japan | 55-42207 |
| Mar. 31, 1980 [JP] | Japan | 55-42208 |
| Mar. 31, 1980 [JP] | Japan | 55-42209 |
| Mar. 31, 1980 [JP] | Japan | 55-42210 |

[51] Int. Cl.³ ............................................. H01J 40/14
[52] U.S. Cl. ................................. 250/578; 358/213
[58] Field of Search .............. 250/578, 211 J; 357/31, 357/32; 358/212, 213

[56] References Cited

U.S. PATENT DOCUMENTS

| 3,715,485 | 2/1973 | Weimer | 178/7.1 |
| 3,824,337 | 7/1974 | Sangster et al. | |
| 4,274,113 | 6/1981 | Ohba et al. | 358/212 |

Primary Examiner—David C. Nelms
Assistant Examiner—Jon Brophy
Attorney, Agent, or Firm—Fitzpatrick, Cella, Harper & Scinto

[57] ABSTRACT

A solid-state photoelectric transducer comprises a plurality of output units for photoelectrically converted signals which units are constructed of: a plurality of photoelectric converter elements, a plurality of signal accumulators for accumulating signals output from said photoelectric converter elements corresponding to an amount of light incident on said photoelectric converter elements, each of said signal accumulators being connected with an associated one of said photoelectric converter elements; a plurality of devices for returning the signal accumulators from a signal accumulating state to an initial state, each of said devices being connected with an associated one of the signal accumulators; a plurality of signal amplifiers for outputting amplified signals corresponding to the signals accumulated in the signal accumulators, each signal amplifier being connected with an associated signal accumulator; and a plurality of cross-talk preventors for preventing cross-talk of the signal output from each signal amplifier, each signal amplifier being provided with one of the cross-talk preventors; a plurality of said signal amplifiers being exclusively selected by a unit selecting signal in each of said output units, said output units having a controlling line which transmits a controlling signal for controlling each of the return devices to the initial state in common, and the signal amplifiers of the same level in each output unit having a signal output line in common.

58 Claims, 49 Drawing Figures

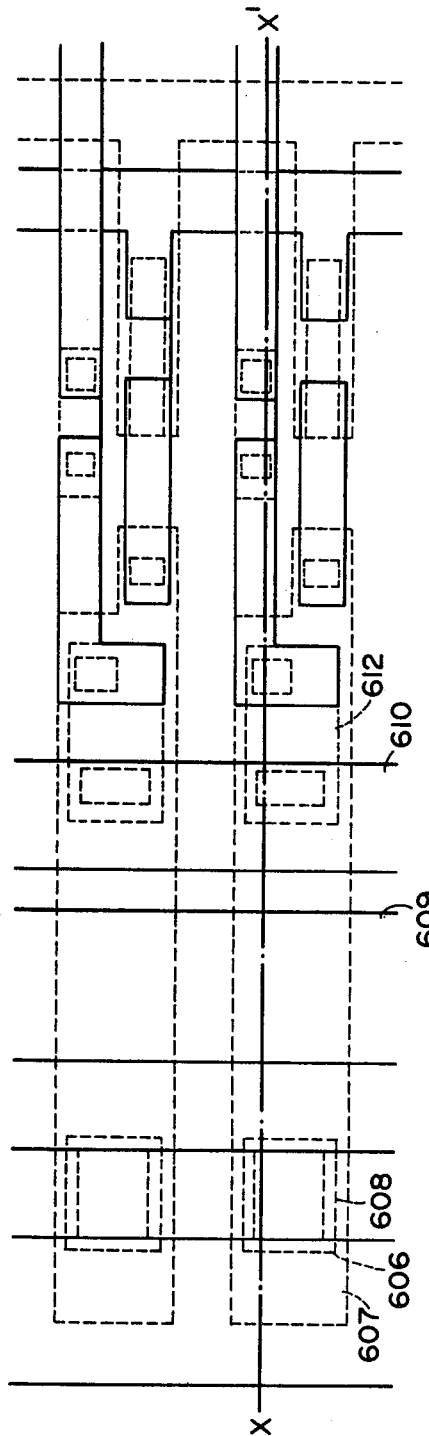
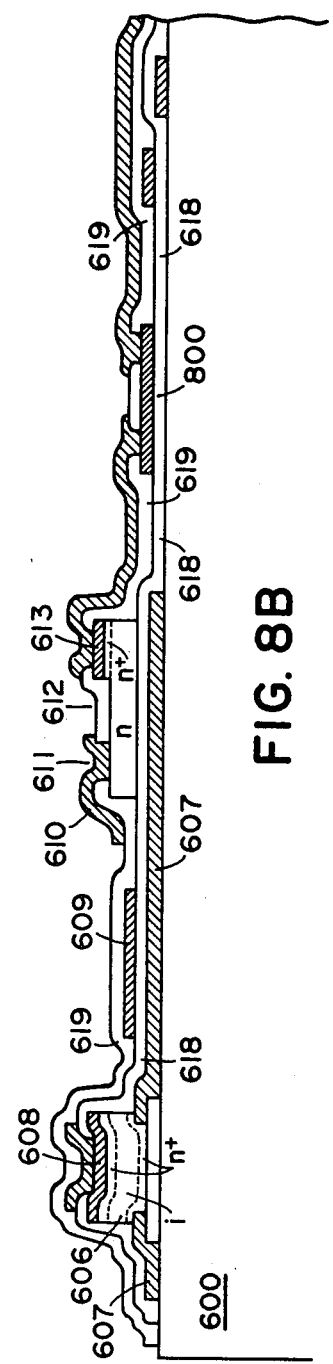

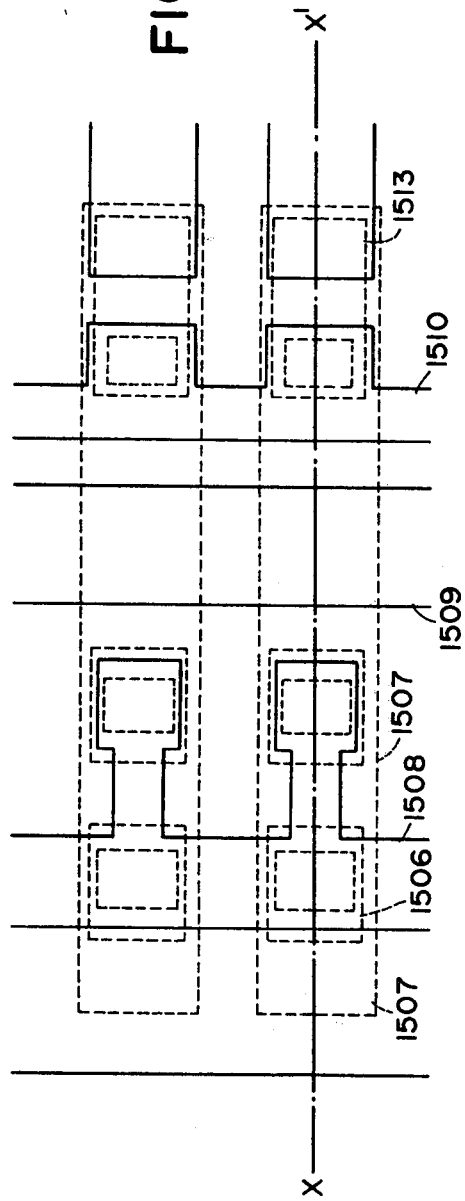
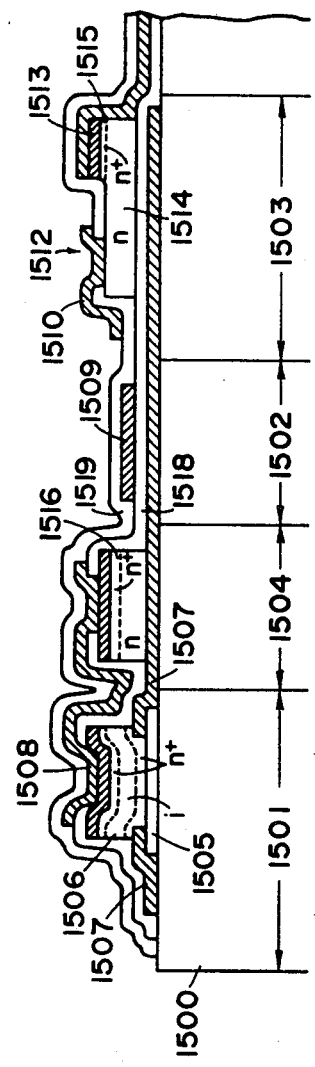
FIG. 15A
FIG. 15B

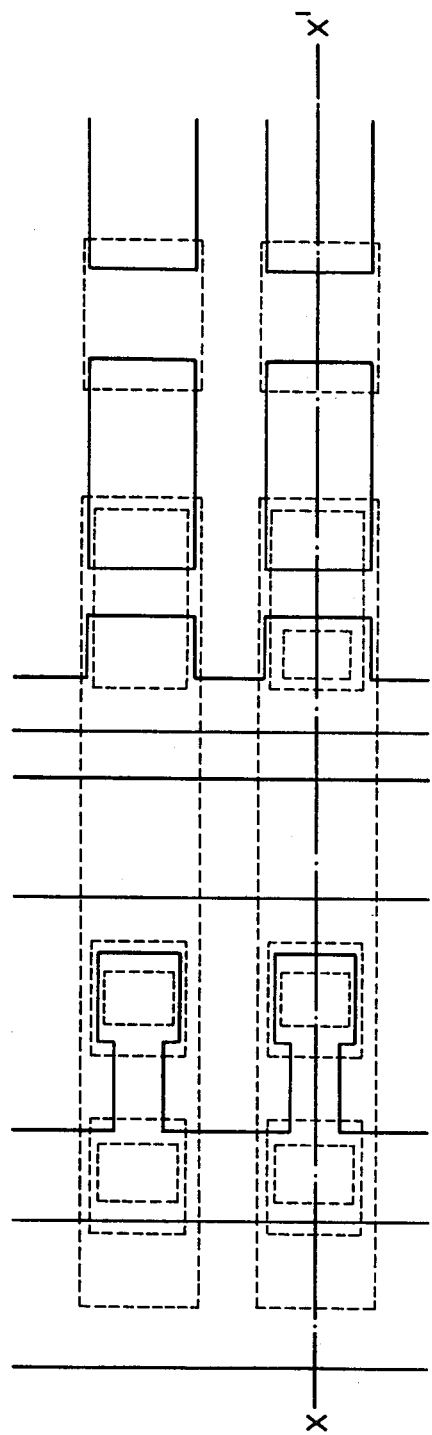
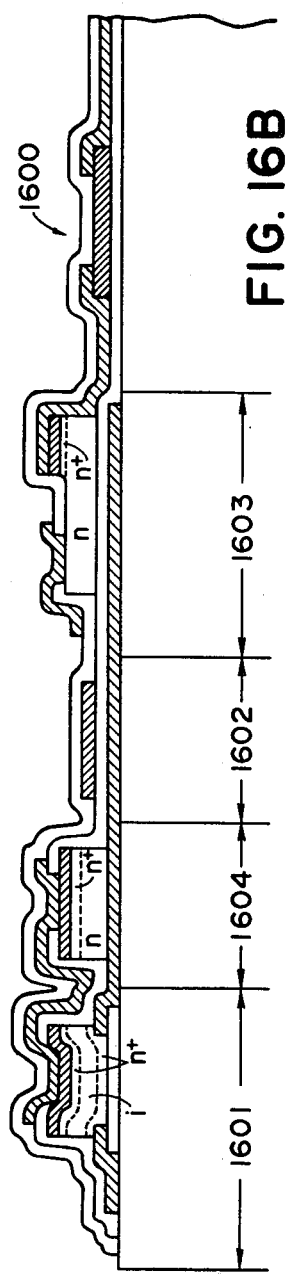

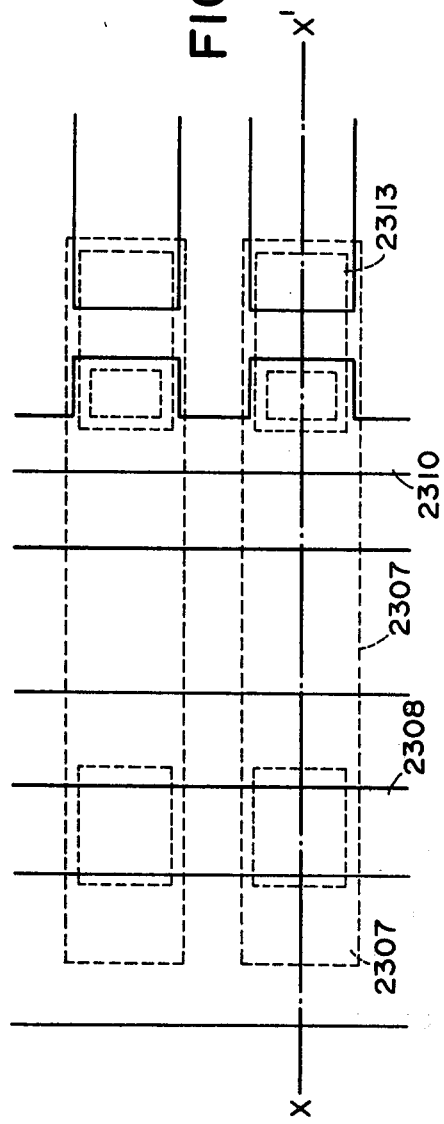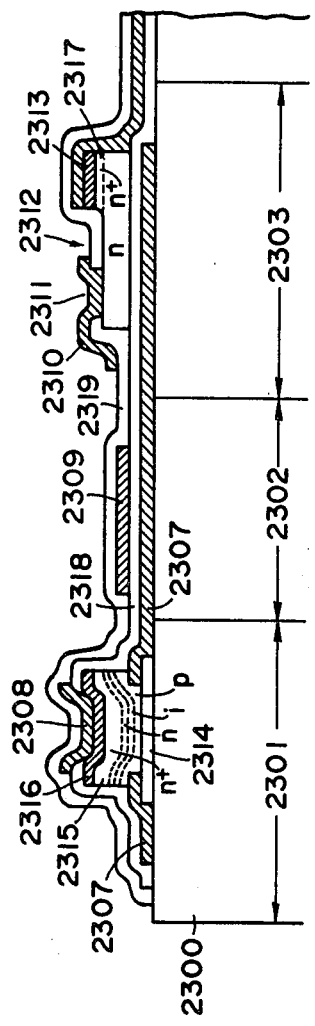

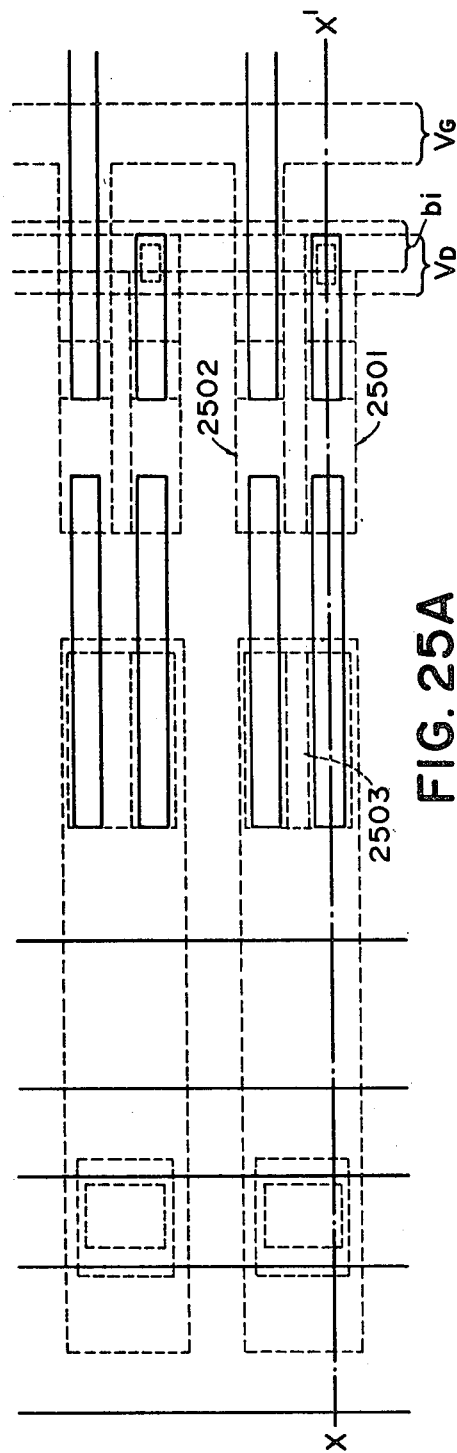
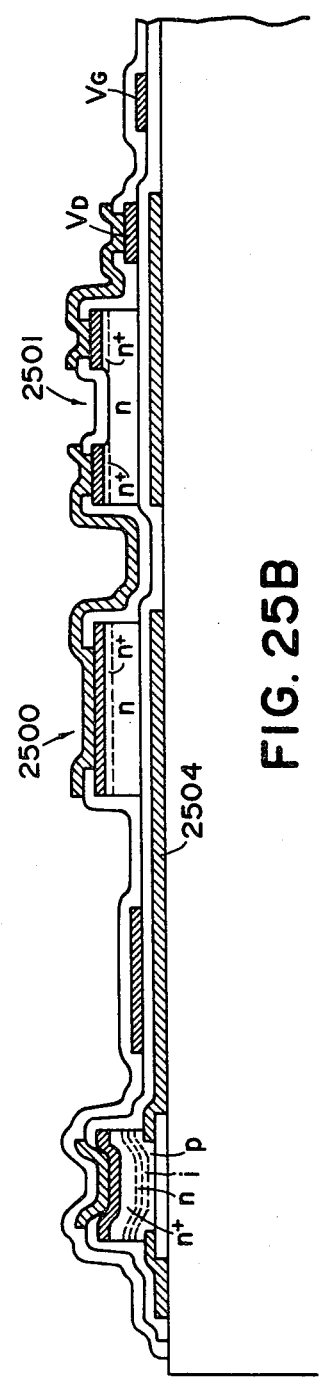
FIG. 25A
FIG. 25B

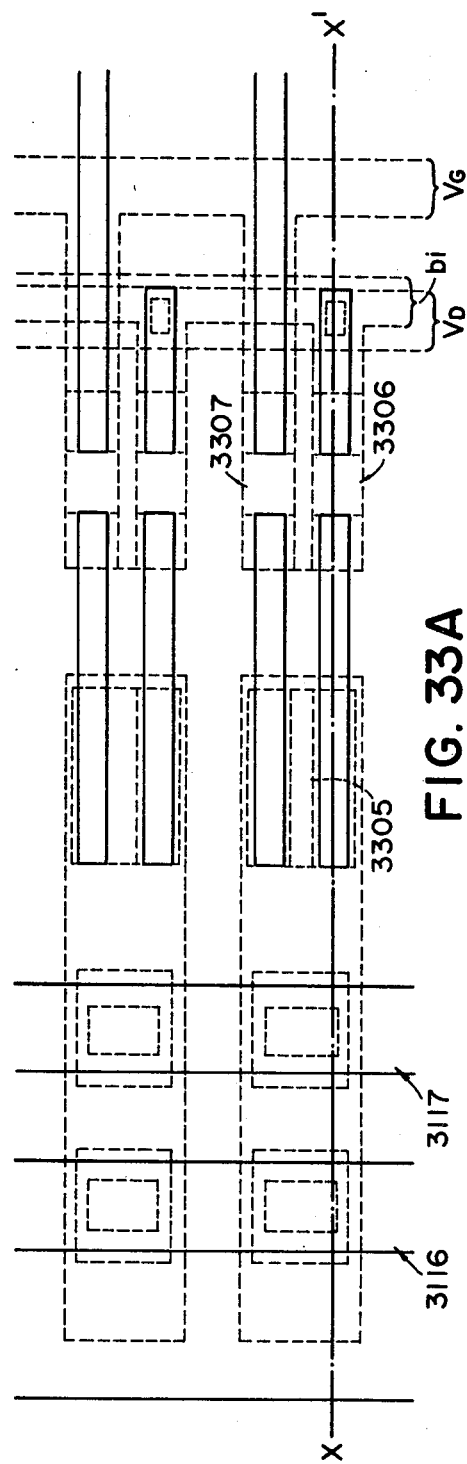
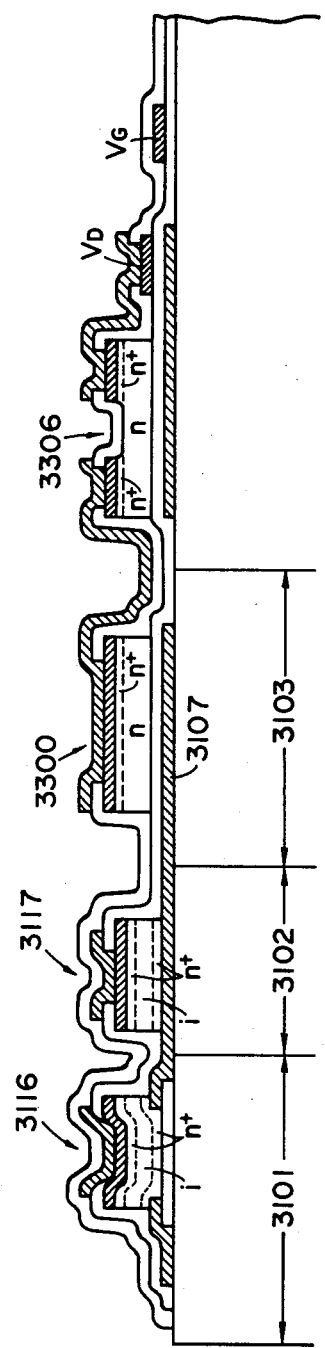
FIG. 33A
FIG. 33B

SOLID-STATE PHOTOELECTRIC TRANSDUCER

BACKGROUND OF THE INVENTION

1. Field of the Invention

This invention relates to a photoelectric transducer which photoelectrically converts light information signals to electric signals and sends them out and particularly, to a solid state photoelectric transducer suitable for letter or image input devices such as, for example, a facsimile, digital copier, laser recording device and the like.

2. Description of the Prior Art

Conventional photoelectric transducers comprise a photoelectric transducer element (picture element) group and a circuit having a scanning ability capable of generating electric signals from the photoelectric transducer element subsequently in time sequence.

There are various types of conventional photoelectric transducers such as a transducer containing a photodiode and MOS.FET (Field Effect Transistor) (hereinafter referred to as "MOS type") or a transducer containing a charge transfer device (CTD) such as CCD (Charge coupled device) and BBD (bucket brigade device) (hereinafter referred to as "CTD type") and the like.

However, since the MOS type and the CTD type use a wafer substrate of silicon single crystal (hereinafter referred to as "C-Si"), the area of a light receiving surface of the photoelectric transducer is restricted by the size of the C-Si wafer. At present, there can be produced a C-Si wafer substrate of at most several inches in size only when uniformity all over the region is required. Therefore, in the case of a photoelectric transducer of MOS type or CTD type employing such a C-Si wafer substrate, the area of the light receiving surface can not exceed the area of the C-Si wafer substrate.

Therefore, a photoelectric converting apparatus having a photoelectric transducer with a light receiving surface having such a limited small area requires that an optical system of large reduction magnification should be placed between an original to be reproduced and a light receiving surface so as to form an optical image of the original on the light receiving surface by way of said optical system, for example, when the photoelectric transducer is used as a light information input device for a digital copier.

In such a case as mentioned above, there is a technical limit as to enhancing the resolving power as shown below. That is, assuming that the resolving power at the photoelectric transducer portion is 10 lines per 1 mm, the longitudinal length of the light receiving surface is 3 cm, and the size of the original is "A4", the optical image formed on the light receiving surface is reduced to about 1/69 times the original and the substantial resolution lowers to about 1.5/mm at the photoelectric transducer. In this way, a substantial resolution lowers in proportion to the size of the original to be produced at a rate of (size of the light receiving surface)/(size of the original).

The above mentioned drawbacks may be solved by enhancing the resolution at the photoelectric transducer portion, but for the purpose of obtaining the required resolution when a substrate having such a limited small area as above is used, it is necessary to enhance the integration density to a great extent and produce construction elements free from defects, but such production technique is not so easy.

There has been proposed a system where a plurality of photoelectric transducers are arranged and the ratio of the longitudinal length of the whole light receiving surface to the length in the direction of main scanning of an original of the maximum size to be reproduced is selected as 1:1 and thereby the optical image formed of the original is divided into the number of the photoelectric transducers resulting in prevention of substantial lowering of the resolution.

However, even in such system, there are the following drawbacks. That is, when a plurality of photoelectric transducers are provided, there are inevitably formed boundary regions between photoelectric transducers where any light receiving surface is not present and therefore, as a whole, the light receiving surface becomes non-continuous and the optical images formed are divided and as to the portions corresponding to the boundary regions, no input occurs at the light receiving surface of the photoelectric transducer apparatus and the reproduced images contains white lines at the corresponding portions and are incomplete. Further, the resulting optical images divided into a plurality of light receiving surfaces are optically reversed images at each light receiving surface so that the whole image is different from the optically reversed image of the original. Therefore, when the optical image formed on the light receiving surface is reproduced as it is, it is not possible to reproduce the original.

As mentioned above, the light receiving surface of a conventional photoelectric transducer is so small that it is very difficult to reproduce information at high resolution. Therefore, it is highly demanded that a photoelectric transducer have a long light receiving surface and a high resolving power. In particular, as a photoelectric transducer apparatus used for a light information input device of a facsimile or digital copier, or image reading device for letters or images of an original, a photoelectric transducer apparatus is essential which has a photoelectric transducer having a light receiving surface of almost the same size as that of an original, not lowering the resolution required for the produced image and capable of reproducing an original with high fidelity.

SUMMARY OF THE INVENTION

An object of the present invention is to provide an improved photoelectric transducer.

Another object of the present invention is to provide a solid state photoelectric transducer having a long light receiving surface, a photoelectric transducer portion of high resolving power, high sensitivity and light weight.

According to one aspect of the present invention, there is provided a solid-state photoelectric converter comprising a plurality of output units for photoelectrically converted signals each unit being constructed of:
   a plurality of photoelectric transducers;
   a plurality of signal accumulating means for accumulating signals output from said photoelectric transducers corresponding to an amount of light incident on said photoelectric transducers, each of said signal accumulating means being directly connected with an associated one of said photoelectric transducers;
   a plurality of means for returning said signal accumulating means from a signal accumulating state to an initial state, each of said means for returning to the initial state being directly connected with one of said signal accumulating means;

a plurality of signal amplifying means for outputting amplified signals corresponding to the signals accumulated in said signal accumulating means, a corresponding one of said signal amplifying means being directly connected with each of signal accumulating means; and a plurality of cross-talk preventing means for preventing cross-talk of said signal output from each of said signal amplifying means, each of said signal amplifying means being provided with each of said cross-talk preventing means;

a plurality of said signal amplifying means being exclusively selected by a unit selecting signal for each of said output units, said output units having a controlling line which transmits a controlling signal for controlling each returning means in common, and said signal amplifying means of the same level in each of said output units having a signal output line in common.

According to another aspect of the present invention, there is provided a solid-state photoelectric converter comprising a plurality of output units for photoelectrically converted signals, each unit being constituted of:

a plurality of photoelectric transducers;

a plurality of signal accumulating means for accumulating signals output from said photoelectric transducers corresponding to an amount of light incident on said photoelectric transducers, each of said signal accumulating means being directly connected with a corresponding one of said photoelectric transducers;

a plurality of means for returning signal accumulating means from a said signal accumulating state to an initial state, each of said means for returning to the initial state being directly connected with one of said signal accumulating means;

a plurality of signal amplifying means for outputting amplified the signals corresponding to signals accumulated in said signal accumulating means, each of said signal amplifying means being directly connected with a corresponding one of said signal accumulating means;

a plurality of cross-talk preventing means for preventing cross-talk of signal output from each of said signal amplifying means, each of said signal amplifying means being provided with one of said cross-talk preventing means; and a plurality of mutually standardizing means for standardizing the operation characteristics of each of said signal amplifying means among said signal amplifying means;

a plurality of said signal amplifying means being exclusively selected by a unit selecting signal for each of said output units, said output units having a controlling line which transmits a controlling signal for controlling each returning means in common, and said signal amplifying means of the same level in each of said output units having a signal output line in common.

According to a further aspect of the present invention, there is a solid-state photoelectric converter comprising a plurality of output units for photoelectrically converted signals each unit being constituted of a plurality of photoelectric transducers;

a plurality of signal accumulating means for accumulating signals output from said photoelectric transducers corresponding to an amount of light incident on said photoelectric transducers, each of said signal accumulating means being directly connected with a corresponding one of said photoelectric transducers;

a plurality of means for returning said signal accumulating means from a signal accumulating state to an initial state, each of said returning means being directly connected with a corresponding one of said signal accumulating means;

a plurality of signal amplifying means for outputting amplified the signals corresponding to signals accumulated in said signal accumulating means, each of said signal amplifying means being directly connected with a corresponding one of signal accumulating means; and a plurality of cross-talk preventing means for preventing cross-talk of signals output from each of said signals amplifying means, each of signal amplifying means being provided with one of cross-talk preventing means;

a plurality of said signal amplifying means being exclusively selected by a unit selecting signal in each of said output units, and said signal amplifying means of the same level in each of said output units having a signal output line in common.

According to a still further aspect of the present invention, there is provided a solid-state photoelectric converter comprising a plurality of output units for photoelectrically converted signals each unit constituted of:

a plurality of photoelectric transducers;

a plurality of signal accumulating means for accumulating signals output from said photoelectric transducers corresponding to an amount of light incident on said photoelectric transducers, each of said signal accumulating means being directly connected with a corresponding one of said photoelectric transducers;

a plurality of signal amplifying means for outputting amplified the signals corresponding to signals accumulated in signal accumulating means, each of said signal amplifying means being directly connected with a corresponding one of said signal accumulating means;

a plurality of cross-talk preventing means for preventing cross-talk of signal output from each of said signal amplifying means, each of said signal amplifying means being provided with one of said cross-talk preventing means; and a plurality of mutually standardizing means for standardizing the operation characteristics of each of said signal amplifying means;

a plurality of said signal amplifying means being exclusively selected by a selecting signal in each unit of said output units, said output units having a controlling line which transmits a controlling signal for controlling each returning means in common, and said signal amplifying means of the same level in each of said output units having a signal output line in common.

According to a still further aspect of the present invention, there is provided a solid-state photoelectric converter comprising a plurality of output units for photoelectrically converted signals, each unit including;

a plurality of photoelectric transducers;

a plurality of signaamplified signals corresponding to signals output from said photoelectric transducers corresponding to an amount of light incident on said photoelectric transducer, each of said signal amplifying means being directly connected with a corresponding one of said photoelectric transducers;

a plurality of cross-talk preventing means for preventing cross-talk of signals output from each of said signal amplifying means, each of said signal amplifying means being provided with one of said cross-talk preventing means; and compensation means for compensating the environmental characteristics of a photoelectric transducer in the output unit;

a plurality of said signal amplifying means being exclusively selected by a selecting signal in each unit of said output units, and said signal amplifying means of the same level in each of said output units having a signal output line in common.

According to a still further aspect of the present invention, there is provided a solid-state photoelectric converter comprising a plurality of output units for photoelectrically converted signals, each unit including:

a plurality of photoelectric transdufers;

a plurality of signal amplifying means for outputting amplified signals corresponding to signals output from said photoelectric transducers corresponding to an amount of light incident on said photoelectric transducer, each of said signal amplifying means being directly connected with a corresponding one of said photoelectric transducers;

a plurality of cross-talk preventing means for preventing cross-talk of signal output from each of said signals amplifying means, each of said signal amplifying means being provided with one of said cross-talk preventing means; and a plurality of mutually standardizing means for standardizing the operation characteristics of each of said signal amplifying means and among said signal amplifying means;

compensating means for compensating the environmental characteristics of the photoelectric transducer in the output unit;

a plurality of said signal amplifying means being exclusively selected by a selecting signal in each unit of said output units, and said signal amplifying means of the same level in each of said output units having a signal output line in common.

DESCRIPTION OF THE DRAWING

FIG. 6A is a plan view and FIG. 6B is a cross sectional view taken along a line X—X' in FIG. 6A;

FIGS. 8A, 8B, 9A and 9B are drawings for explaining some embodiments of the present invention, in FIGS. 8 and 9 "B" is a cross sectional view taken along a line X—X' in "A" of both Figures;

FIGS. 14, 15A and 15B explains an embodiment of the present invention where FIG. 15B is a cross sectional view taken along a line X—X' in FIG. 15A;

FIGS. 16A, 16B, 17A and 17B are for explaining embodiments according to the present invention where "B" is a cross sectional view taken along a line X—X' in "A";

FIGS. 22, 23A and 23B are for explaining embodiments of the present invention;

FIGS. 24A, 24B, 25A and 25B are for explaining embodiments of the present invention where each "B" is a cross sectional view taken along a line X—X' in each "A";

FIG. 31B is a cross sectional view taken along a line X—X' in FIG. 31A; and FIGS. 32A, 32B, 33A and 33B explain embodiments of the present invention, where each "B" is a cross sectional view taken along a line X—X' in each "A".

DETAILED DESCRIPTION OF THE PREFERRED EMBODIMENTS

Figure 1:
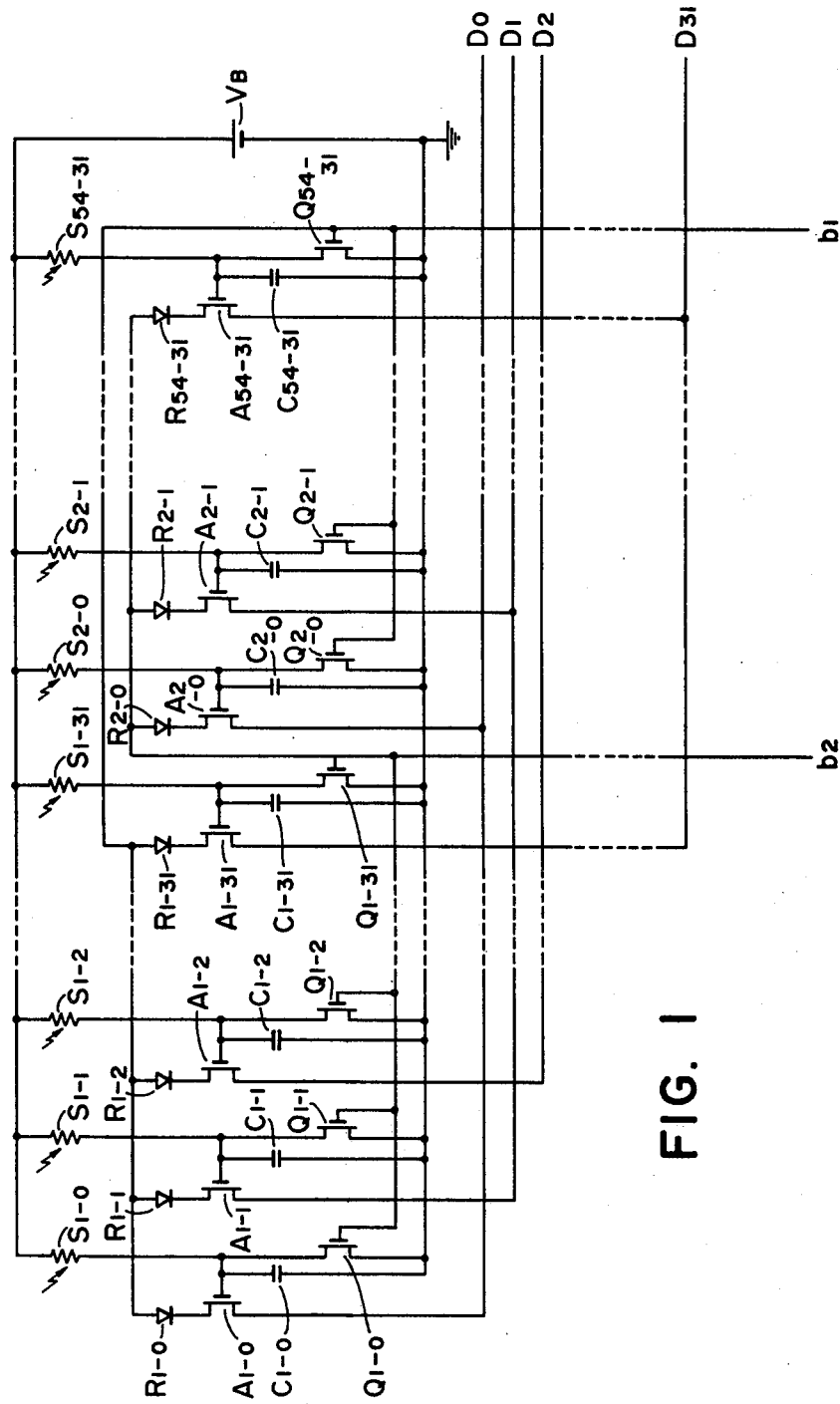
FIGS. 1, 2, 3A and 3B show scanning circuits of embodiments of the present invention.

FIG. 1 illustrates a scanning circuit which is the first embodiment of the present invention. To 1728 ($=54\times32$) photoconductive elements $S_{1-0}$ to $S_{54-31}$, which are necessary for realizing image reading at a density of about 8 image-elements/mm in the short direction of an A4 size manuscript, is supplied electricity from an external bias power source $V_B$. Charge-storing capacitors $C_{1-0}$ to $C_{54-31}$ store or accumulate charges at a rate in accordance with the quantity of the incident light on the respective photoconductive elements. Accordingly, the potential at the connection point of the capacitors $C_{1-0}$–$C_{54-31}$ and the gates of selective amplifying MOS transistors $A_{1-0}$–$A_{54-31}$ is a value corresponding to the incident light quantity during a certain charge-storing period of time. In the scanning circuit shown in FIG. 1, the charge-storing capacitor is expected to have effect as a low-pass filter together with the photoconductive element from an aspect of the circuit. If a voltage is applied exclusively to the wiring at the drain side common to 32 amplifying MOS transistors, for example a block driving line $b_1$, the amplifying MOS (or MIS) transistors $A_{1-0}$–$A_{1-31}$ are biased in accordance with the potential of the above-mentioned connection point, and each amplifying MOS (or MIS) transistor has a channel resistance corresponding to the quantity of the incident light on the photoconductive element connected therewith. Signal current in response to the quantity of the incident light on the photoconductive elements $S_{1-0}$–$S_{1-31}$ is automatically output to individual data lines $D_0$–$D_{31}$. It is clear that the data lines $D_0$–$D_{31}$ should be connected with an input circuit of low inpedance such as a current amplifier etc. for the purpose of securing the above-mentioned operation.

Diodes $R_{1-0}$–$R_{54-31}$ for current separation are disposed to ensure separation between the amplifying MOS (or MIS) transistors $A_{1-0}$–$A_{54-31}$ connected with the data lines $D_0$–$D_{31}$, particularly at the time of non-selection of the transistor.

Successively, when a voltage is supplied exclusively to a driving line $b_2$, electric discharging MOS (or MIS) transistors $Q_{1-0}$–$Q_{1-31}$ become electrically conductive so that the charges stored in the storing or accumulating capacitors $C_{1-0}$–$C_{1-31}$ belonging to the first group of the photoconductive elements $S_{1-0}$–$S_{1-31}$ are discharged through the transistors $Q_{1-0}$–$Q_{1-31}$.

It is advantageous to connect the gate line common to the discharging transistors $Q_{1-0}$–$Q_{1-31}$ with the drain line common to the amplifying transistors $A_{2-0}$–$A_{2-31}$ belonging to the second group of photoconductive elements $S_{2-0}$–$S_{2-31}$ to drive the transistors in that the number of the controlling line from an external apparatus to the photoelectric transducer apparatus of the invention can be decreased. However, these transistors may be separately driven depending upon difference in the driving voltage therefor, determination of the timing for driving them and other problems.

If electricity is supplied to the common source line of the discharging transistors $Q_{1-0}$–$Q_{54-31}$ from a separate bias power source in view of the transfer characteristics of the amplifying transistors $A_{1-0}$–$A_{54-31}$ with respect to threshold voltage etc., possibilities of designing the element can be widened, which effect is clearly understood.

Figure 2:
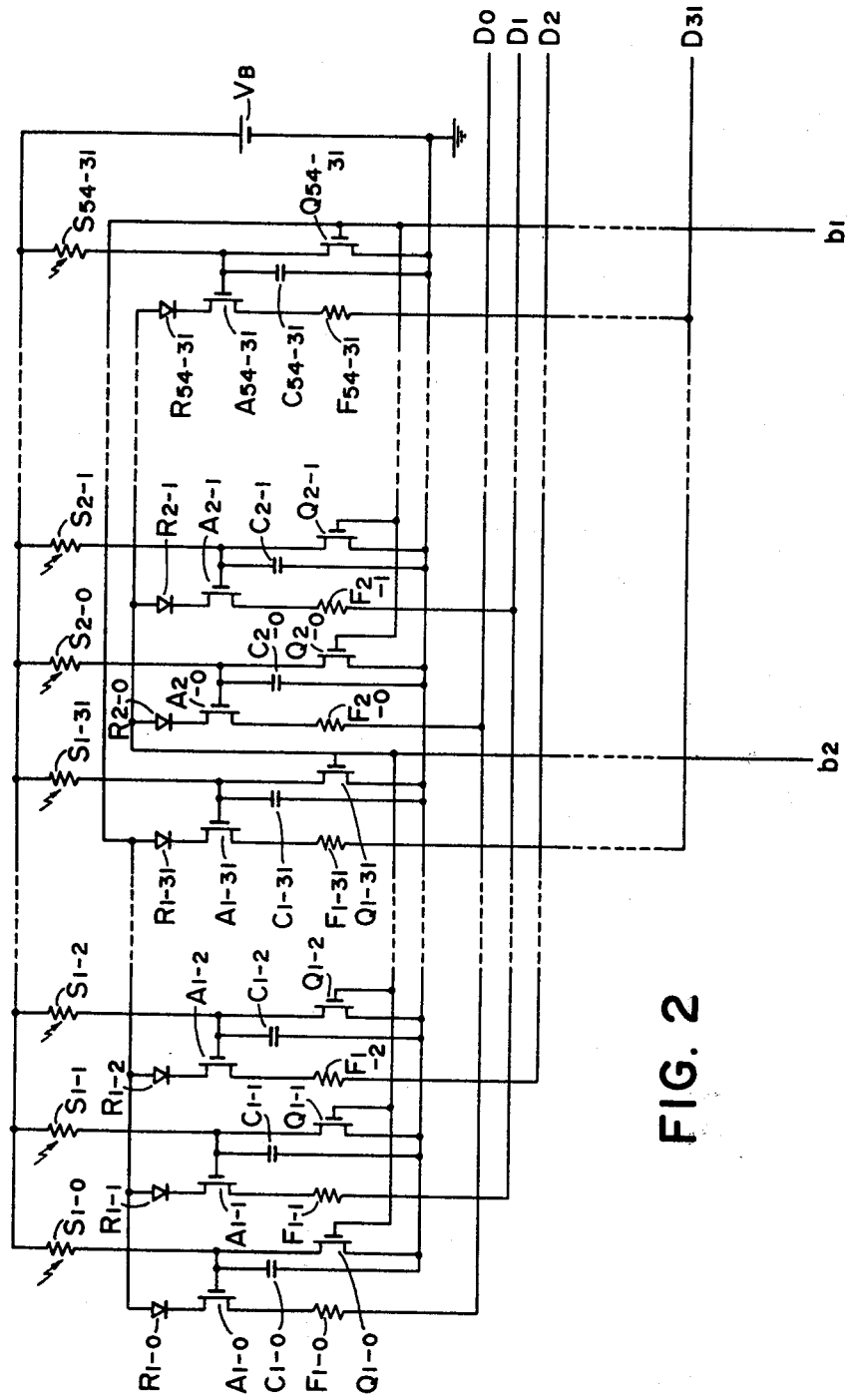

FIG. 2 illustrates a scanning circuit which is the second embodiment of the invention. The first embodiment shown in FIG. 1 can be expected to attain sufficient technical effect when high accuracy in reading for the quantity of the incident light is not required, or when the amplifying transistors are low in the transfer characteristics, particularly in the distribution of the threshold voltage with respect to the same lot product. Further, the first embodiment is simple in its circuit structure. However, the distribution of the transfer characteristics becomes problematic in some cases, for example when particularly high accuracy is required in reading information of the light quantity. For the purpose of resolving such problem, the second embodiment shown in FIG. 2 is an example for realizing uniform transfer characteristic as a whole by connecting each source of the amplifying transistors $A_{1-0}$–$A_{54-31}$ with a resistor and utilizing the current feedback. The circuit operation will be made clear from the explanation in connection with the first scanning circuit if it is understood that negative feedback utilizing the current feedback is applied to the operation of the amplifying transistors $A_{1-0}$–$A_{54-31}$.

Figure 3A:
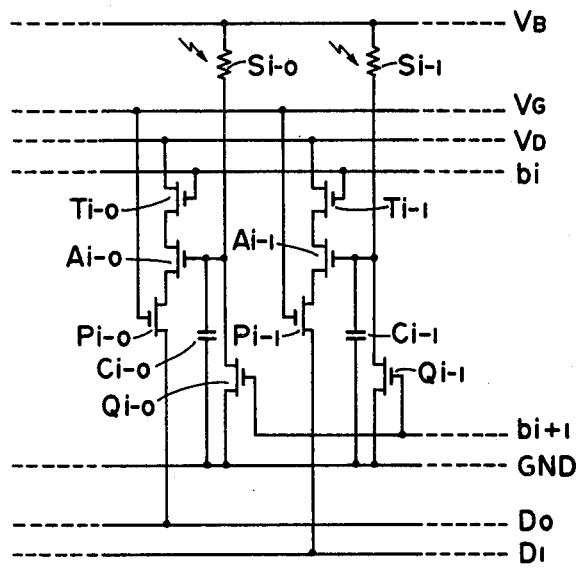
Figure 3B:
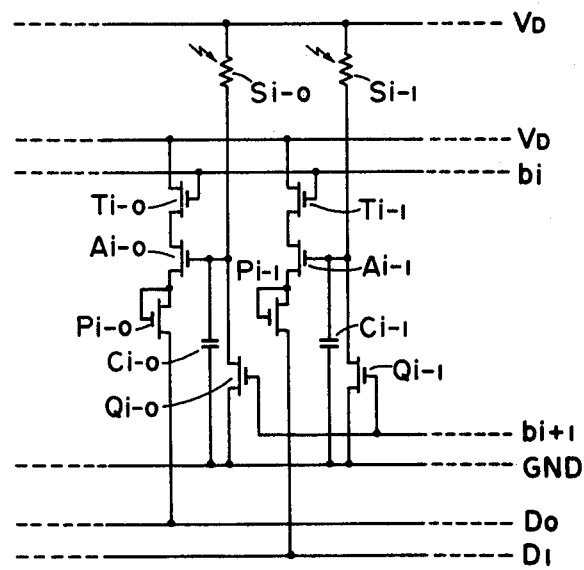

A further scanning circuit which is the third embodiment of the invention is illustrated in FIG. 3A, while its modification is shown in FIG. 3B. In these embodiments, nonlinear operating elements $P_{1-0}$–$P_{54-31}$ (only a portion of the elements is shown) are used as the elements for realizing the above-mentioned current feedback in place of the resistors, and MOS (or MIS) transistors $T_{1-0}$–$T_{54-31}$ (only a portion thereof is shown) are employed as the separation means from the common line at the drain side of the amplifying transistors. Particularly, the amplifying transistors $A_{1-0}$–$A_{54-31}$ (only a portion thereof is shown), discharging transistors $Q_{1-0}$–$Q_{54-31}$ (only a portion thereof is shown) and separating transistors $T_{1-0}$–$T_{54-31}$ (only a portion thereof is shown) may be constituted of elements produced by the same technology, which brings about such a great effect that integration can be easily achieved.

Figure 4:
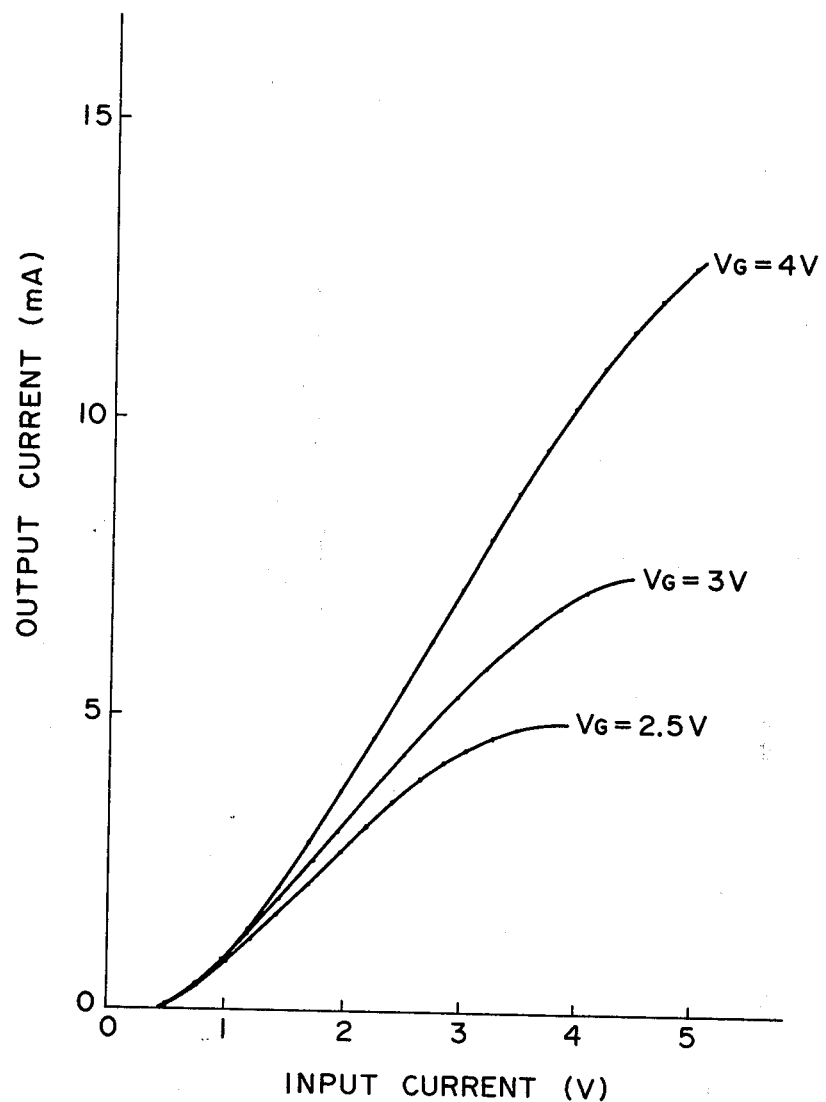
FIG. 4 shows change of transferring characteristics referring to common gate bias values in the present invention.

In particular, the embodiment shown in FIG. 3A is characterized in that the transfer characteristic can be programmed by varying a bias voltage $V_G$ supplied to the gate line common to the transistors $P_{1-0}$–$P_{54-31}$ for current feedback. Change in the transfer characteristic with respect to various bias values $V_G$ for the common gate is as illustrated in FIG. 4.

In the above-mentioned scanning circuit, the output from the photoconductive element in always amplified (in the above embodiment, the output signal from such element is converted into a current, which is then amplified) to forward signal from the matrix wiring section. Generally, the conductivity of the photoconductive element is considerably low. Further, wide matrix wiring is required in the application of the photoelectric transducer apparatus of the invention to the elongated image-reading apparatus required for the digital copier, facsimile etc., which are main uses of the photoelectric transducer apparatus. Therefore, it is necessary to process electric signals of very low level through the long wiring, in which case good SN (signal:noise) ratio cannot be expected frequently. One of great features of the present invention resides in that a selection element connected with the output terminal of the photoconductive element is given amplifying function and each element can be driven with the above-mentioned matrix wiring section being considered to be low in the impedance and further a bad influence such as for example noise is decreased to a great extent.

Figure 5:
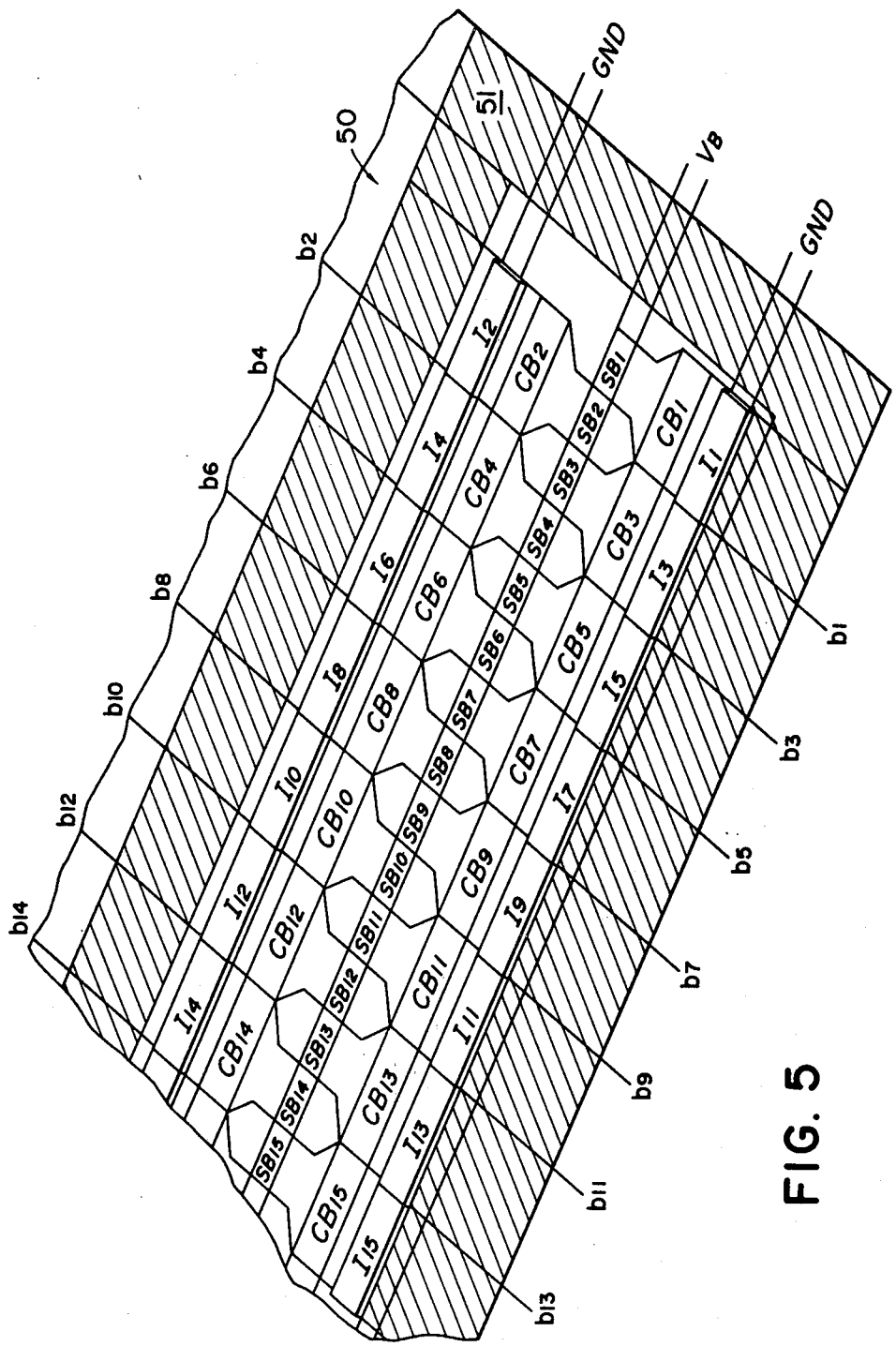
FIGS. 5, 6A and 6B are drawings for explaining embodiments of the present invention.

The structure of the photoelectric transducer apparatus according to the present invention will be explained with reference to FIG. 5, in which a portion of the structure is schematically shown. Photoconductive elements $SB_1$–$SB_{54}$ (the drawing shows $SB_1$–$SB_{15}$) formed in an array on a transparent substrate 50 made of for example glass are connected with integrated scanning circuits $I_1$–$I_{52}$ (the drawing illustrates $I_1$–$I_{15}$) through electrode wiring and capacitors $CB_1$–$CB_{54}$ (the drawing shows $CB_1$–$CB_{15}$) as formed on the same substrate 50 by the thin film forming technique. The connection is effected by the wire bonding method. The output lines from the scanning circuits $I_1$–$I_{54}$ are also connected with an electrode provided on the substrate by vapor deposition. The connection is also carried out by the wire bonding method. The output lines extend to the matrix wiring section 51 and ultimately to the output electrode. External controlling lines such as driving lines $b_1$–$b_{54}$ are connected with the substrate having thereon the scanning circuits through the electrode wiring on the substrate 50. The photoelectric transducing element in the photoelectric transducer apparatus of the hybrid structure as shown in this embodiment has the same structure as that of the photoelectric transducing element in the photoelectric transducer apparatus of the monolithic structure which will be explained in the following embodiment, and therefore its structure will be described in detail at that time.

Figure 6A:
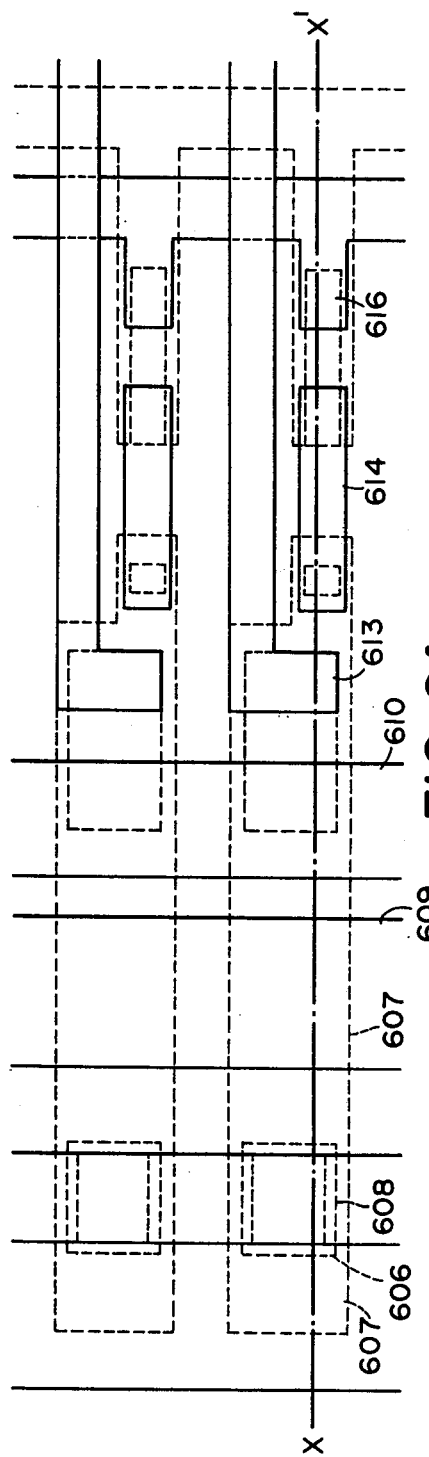
Figure 6B:
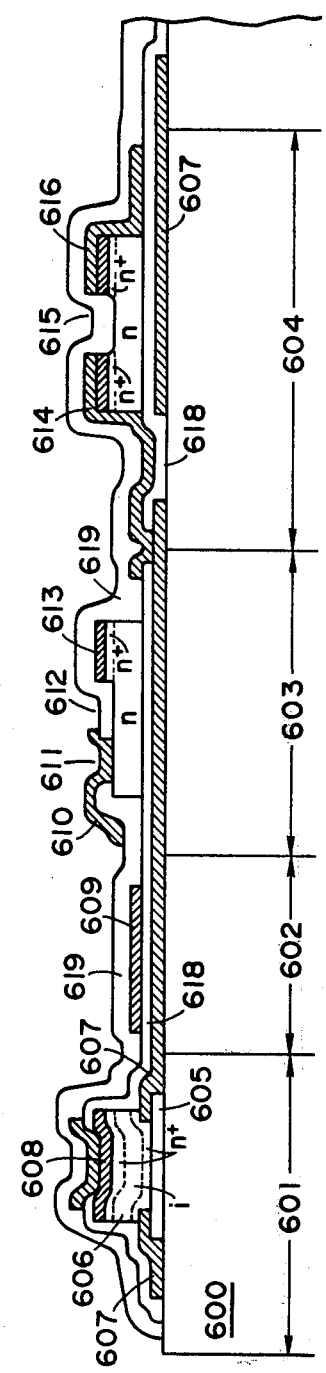

The embodiment of the structure shown in FIG. 6 is an example of the photoelectric transducer apparatus according to the invention. In this embodiment, the components in the scanning circuit shown in FIG. 1 are all mounted on a single substrate by the thin film forming technique using vacuum deposition. FIG. 6A is a plain view of this embodiment, and FIG. 6B is a cross-sectional view taken at the position indicated by X—X' in FIG. 6A. On the substrate, there ae provided a photoelectric transducer section 601, charge storing or accumulating section 602, selective amplifying section 603, and discharging section 604; and matrix wiring section, electrode for input and output of signal and electrode for supply of power source which are positioned at the right side of the drawing although those are not shown. The matrix wiring section is a general one as outlined in FIG. 7, in which numerals 70–74 denote through-hole connection portions and 75 corresponds to the photoelectric transducer section and scanning circuit section.

The individual electrode 605 for the photoelectric transducing section 601 is formed by vapor deposition of a transparent conductive material such as for example indium tin oxide (ITO) so that incidence of the light passing through the transparent substrate 600 may be possible. Electrode 607 is formed by vapor deposition of a light intercepting electrode material such as for example chromium (Cr) for the purpose of achieving uniform shape of the image-element. These electrodes are fabricated independently for each image-element by the photo-etching method. A photoconductive film 606 of amorphous hydrogenated silicon (hereinafter called "a-Si:H") is further formed on the individual electrode 605. The thin film 606 is provided in such a manner that the glow discharge is produced in mixed gas containing for example SiH4 gas and H2 gas to form a photoconductive thin film of a-Si:H deposited due to decomposition of SiH4, which film is then treated by the photo-etching method. The photoconductive film 606 of a-Si:H is provided for each image-element. Successively, a common opposite electrode 608 is formed by the thin film forming method (including vapor deposition and etching processes) using a metal material such as for example Al.

In the process for forming a deposition film utilizing the above-mentioned glow discharging decomposing method, it is possible to form an a-Si:H thin film of n-type or p-type conductivity by introducing PH3 gas or B2H6 gas in an appropriate concentration into the SiH4/H2 gas used in such process. It is also possible to form continuously an a-Si:H film of each conductivity type without any contact with the external air. For example, the upper surface portion and lower surface portion of the above-mentioned a-Si:H photoconductive film are doped with P atoms in a high concentration to form n+ layers so that the ohmic contact with the electrode metal is ensured. The method for forming the a-Si:H film with each conductivity type will now be referred to, one by one, in the following description.

The charge-storing section 602 is constituted of a capacitor fabricated in such a manner that a thin film 618 of SiO2 or Si3N4 is formed on the light intercepting electrode 607 by the sputtering method etc. and treated by the pattern etching method and further an earthing electrode 609 is provided on the thin film 618 by the thin film forming method.

The amplifying thin film transistor 612 has the MIS (metal insulator semiconductor) structure. The electrode 607 for light interception supplies potential generated due to the charges stored in the charge-storing section 602 to the gate of the transistor with the MIS structure.

The semiconductor thin film for constituting the amplifying transistor 612 and discharging transistor 615 may be composed preferably of a-Si:H or polycrystalline silicon. Polycrystalline silicon is prepared by the thermal decomposition (CVD) of SiH4 gas, decomposition of SiH4 gas due to the glow discharge (glow discharging CVD), or vapor deposition in a high vacuum (HVD).

Also, in the process of forming a polycrystalline silicon film, PH3 gas or B2H6 gas in an appropriate concentration may be introduced into the SiH4 gas to impart n-type or p-type conductivity to the resulting film.

The polycrystalline film is formed at a temperature of about 400° C. or above, which is higher than the temperature at which the a-Si:H film is formed. Formation of the latter film is carried out at about 180°–250° C. Therefore, when the semiconductor thin films for constituting the photoconductive element and MIS transistor are formed, a film for the MIS transistor is first formed, and thereafter a film for the photoconductive element is formed.

In the selective drain electrode portion 611 of the transistor 612, the n+ layer is removed by utilizing dependence of the etching rate for the Si thin film upon the doping concentration of P atom. The drain selective electrode 610 is composed of a metal material such as for example Al. As a result, a Schottky barrier diode having a function of the separation diode as indicated by $R_{1-0}$–$R_{54-31}$ in FIG. 1 is formed. In the contact portion of the electrode 613 at the source side, the n+ layer remains to maintain the ohmic contact. An insulating layer 619 is composed of an insulating film such as a sputtered film of Si3N4, SiO2 and the like. Such insulating layer is formed, particularly for the purpose of decreasing the capacitive coupling between the selective drain electrode 610 and light intercepting electrode 607 which is an output line from the photoelectric transducing section.

In the MIS transistor 615 constituting the discharging section 604, the drain electrode and source electrode (indicated by 614 and 616) are connected through the n+ layer containing Si as the matrix so that the ohmic contact may be maintained. The n+ layer in the Si film between the drain electrode 614 and source electrode 616 is removed by the photo-etching method.

FIGS. 8A and 8B illustrate an embodiment of a photoelectric transducer apparatus, to which resistors $F_{1-0}$–$F_{54-31}$ for current feedback are incorporated as shown in FIG. 2. FIG. 8A is a schematic plan view, while FIG. 8B is a cross-sectional view taken along the line X—X' in FIG. 8A. Each section is disposed in the same manner as in the case of FIG. 6 with the exception that a resistor 800 is provided. The resistor may be composed of a-Si (amorphous silicon) with an appropriate doping amount, suitable metal oxides, borides, nitrides and the like.

Figure 9A:
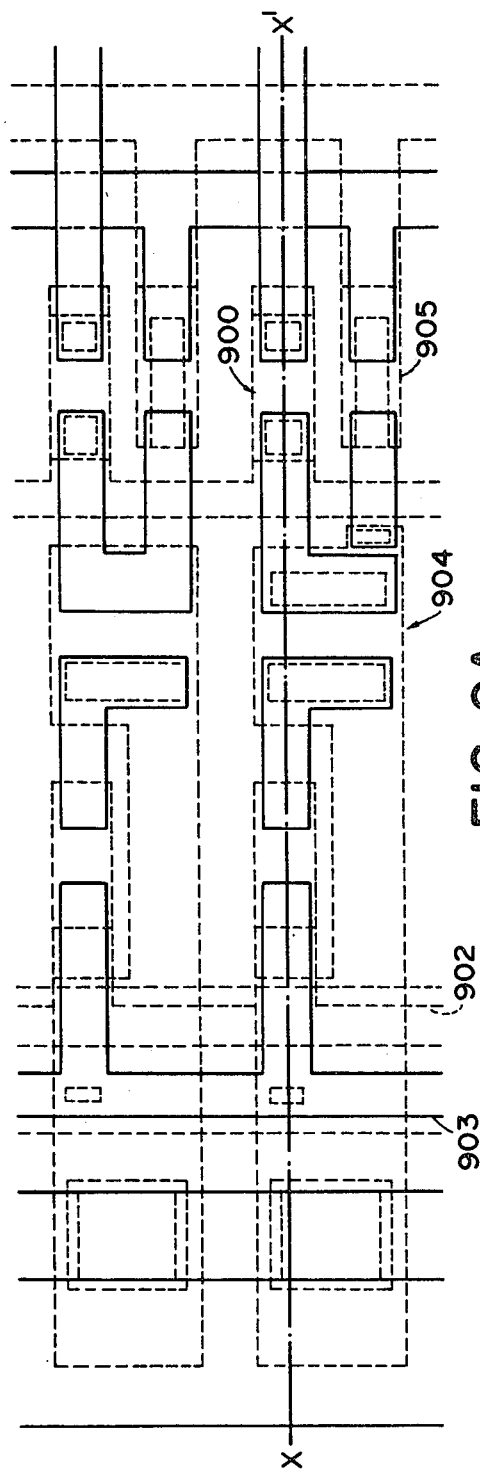
Figure 9B:
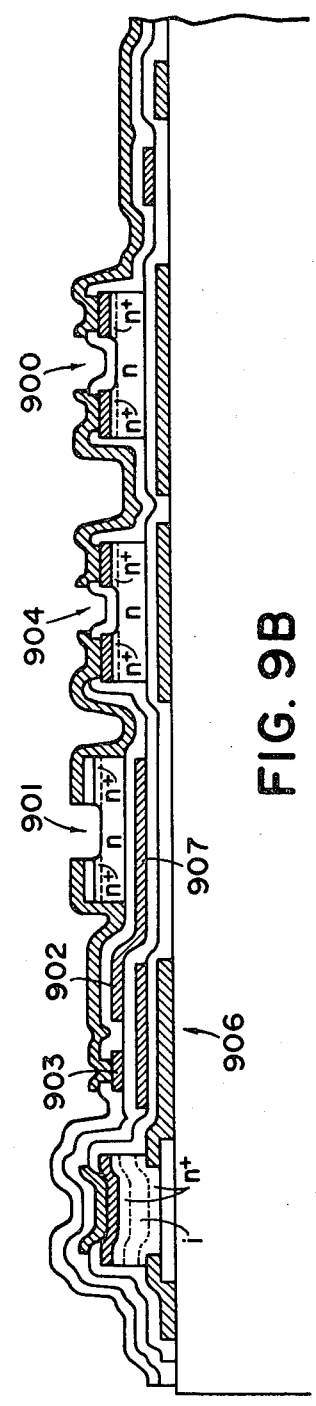

FIGS. 9A and 9B illustrate an embodiment using MIS transistor as a current feedback element. The corresponding scanning circuit is shown in FIG. 3A. Each section in this embodiment is disposed in substantially the same fashion as in the case of FIG. 6 with the exception that a MIS transistor 900 for current feedback is formed at a position parallel to the discharging transistor 905 and that a MIS transistor 901 is further provided as a separation element between the charge-accumulating section 906 and amplifying MIS transistor 904. The difference between the amplifying MIS transistor 612 shown in FIG. 6 and amplifying MIS transistor 904 illustrated in FIG. 9 resides in that the drain of the latter transistor is designed so at to maintain the ohmic contact with the electrode metal. Further, the gate 907 of the separation MIS transistor 901 is connected with the input line 902 of the selective signal line $b_i$, and the drain is connected with the transistor power source line 903.

Figure 10:
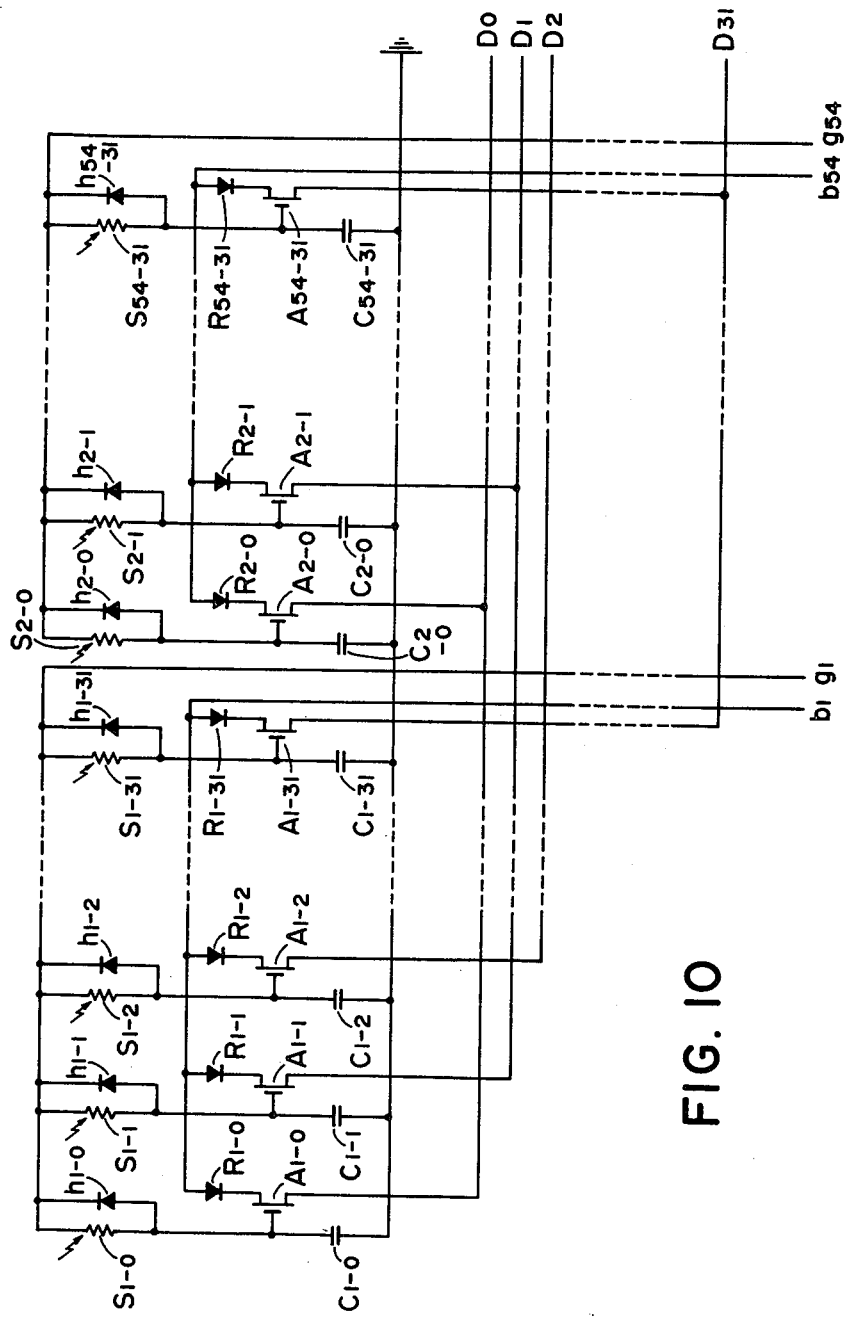
FIGS. 10, 11, 12A and 12B show scanning circuits of other embodiments according to the present invention.

FIG. 10 illustrates a scanning circuit which is the fourth embodiment of the present invention. To 1728 (=54×32) photoconductive elements $S_{1-0}$ to $S_{54-31}$, which are necessary for realizing image reading at a density of about 8 image-elements/mm in the short direction of an A4 size manuscript, is supplied electricity from an external bias power source $V_B$. Charge-storing capacitors $C_{1-0}$ to $C_{54-31}$ store or accumulate charges at a rate in accordance with the quantity of the incident light on the respective photoconductive elements. Accordingly, the potential at the connection point of the gates of amplifying MOS transistors $A_{1-0}-A_{54-31}$ which select capacitors $C_{1-0}-C_{54-31}$ is a value corresponding to the incident light quantity during a certain charge-storing period of time. In the scanning circuit, the charge-storing capacitor is expected to have effect as a low-pass filter together with the photoconductive element from an aspect of the circuit. When a voltage is applied exclusively to the wiring at the drain side common to 32 amplifying MOS transistor, for example a block driving line $b_1$, the amplifying MOS (or MIS) transistors $A_{1-0}-A_{1-31}$ are biased in accordance with the potential of the above-mentioned connection point, and each amplifying MOS (or MIS) transistor has a channel resistance corresponding to the quantity of the incident light on the photoconductive element connected therewith. Signal current in response to the quantity of the incident light on the photoconductive elements $S_{1-0}-S_{1-31}$ is automatically output to individual data lines $D_0-D_{31}$. It is clear that the data lines $D_0-D_{31}$ should be connected with an input circuit of low impedance such as a current amplifier etc. for the purpose of securing the above-mentioned operation.

Diodes $R_{1-0}-R_{54-31}$ for current separation are disposed to ensure separation of signal current between the amplifying MOS (or MIS) transistors connected with the data lines $D_0-D_{31}$, particularly at the time of non-selection of the transistor. Further, while an electrical potential is exclusively supplied to block driving line $b_2$ (not shown on the drawing) for selecting output from the second photoconductive element $S_{2-0}-S_{2-31}$ group, charges accumulated on capacitors $C_{1-0}-C_{1-31}$ by feeding potential to discharge controlling line $g_1$ which connects to the group $h_{1-0}-h_{1-31}$ belonging to the first photoconductive element $S_{1-0}-S_{1-31}$ group of diodes, as discharge elements, so as to make forward bias on the diodes, becomes discharged through the said diodes. After completion of the discharge, when a potential applies so as to reversely bias the diodes, each capacitor starts to store charge at a corresponding rate to an incidental light quantity to each photoconductive element.

Figure 11:
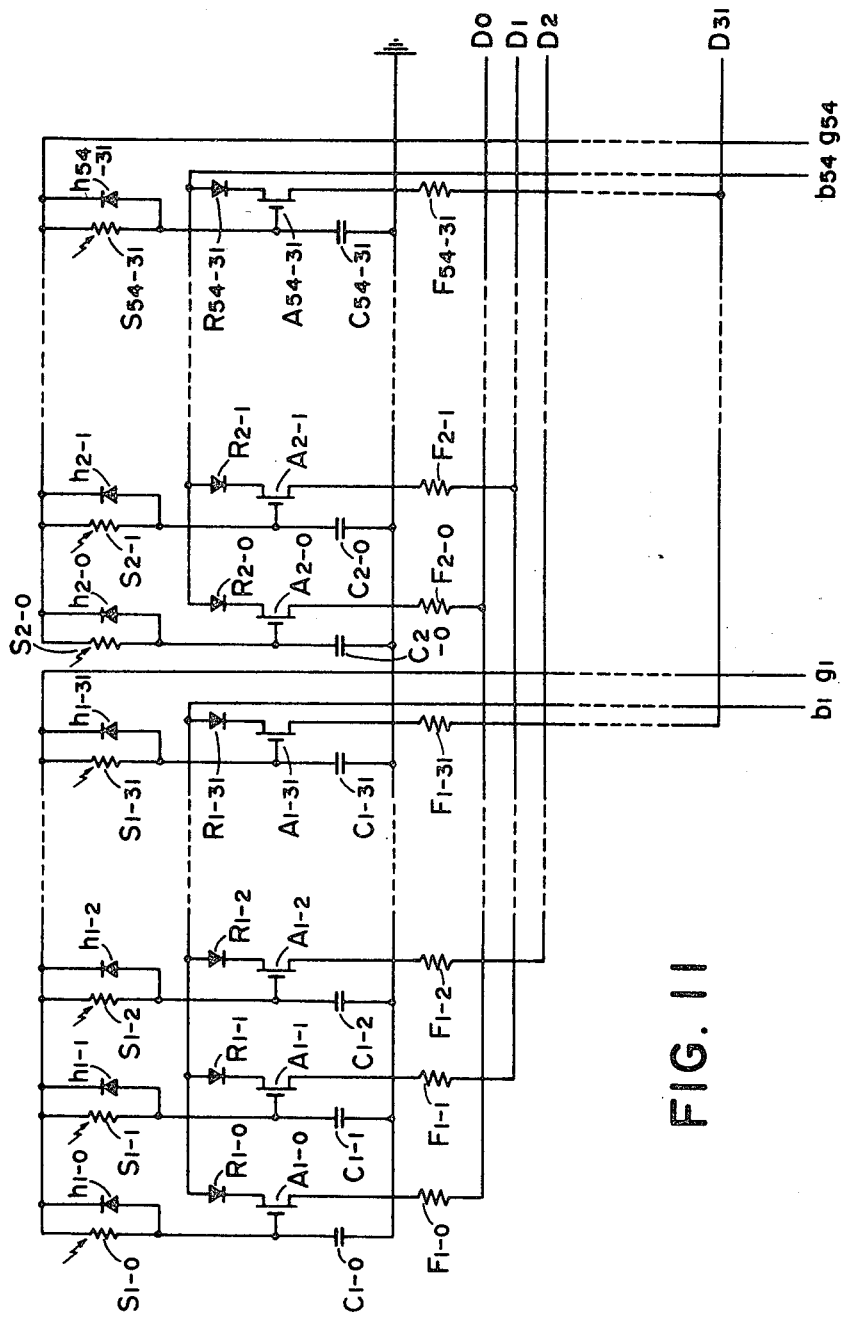

FIG. 11 illustrates a scanning circuit which is the fifth embodiment of the invention. The fourth embodiment shown in FIG. 10 can be expected to attain sufficient technical effect when high accuracy in reading for the quantity of the incident light is not required, or when the amplifying transistors are low in the transfer characteristics, particularly in the distribution of the threshold voltage with respect to the same lot product. Further, the first embodiment is simple in the circuit structure. However, the distribution of the transfer characteristics becomes problematic in some cases, for example when particularly high accuracy is required in reading information of the light quantity. For the purpose of resolving such problem, the second embodiment shown in FIG. 11 is an example for realizing a uniform transfer characteristic as a whole by connecting each source of the amplifying transistors $A_{1-0}-A_{54-31}$ with a resistor and utilizing the current feedback. The circuit operation will be made clear from the explanation in connection with the fourth scanning circuit if it is understood that negative feedback utilizing the current feedback is applied to the operation of the amplifying transistor $A_{1-0}-A_{54-31}$.

Figure 12A:
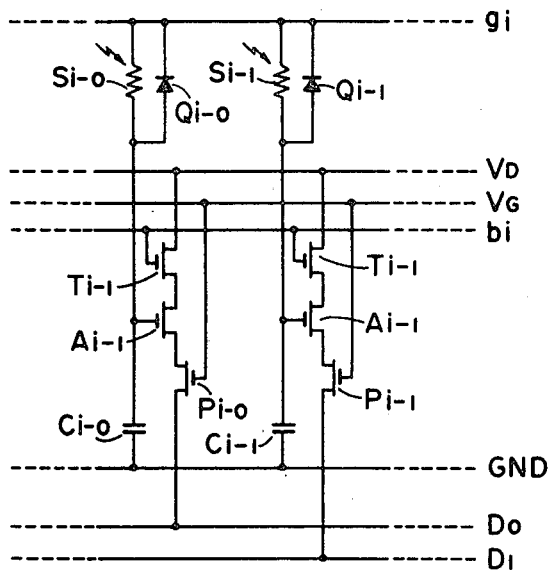
Figure 12B:
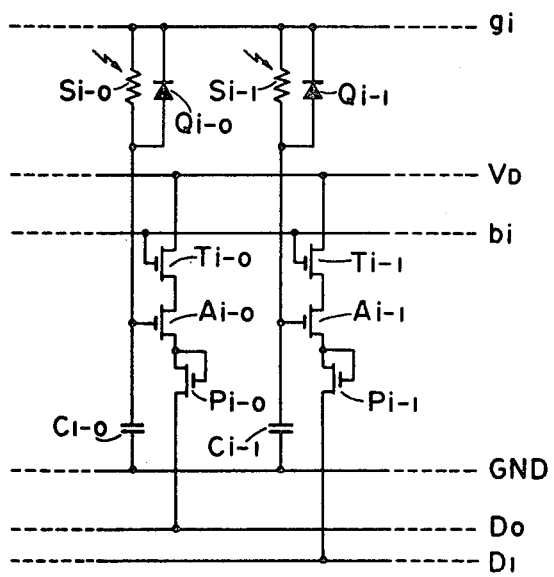

A further scanning circuit which is the sixth embodiment of the invention is illustrated in FIG. 12A, while its modification is shown in FIG. 12B. In these embodiment, non-linear operating elements $P_{1-0}-P_{54-31}$ (only a portion of the elements is shown) are used as the elements for realizing the abovementioned current feedback in place of the resistors and MOS (or MIS) transistors $T_{1-0}-T_{54-31}$ are employed as the separation means from the common line at the drain side of the amplifying transistors. Particularly, the amplifying transistors $A_{1-0}-A_{54-31}$, discharging diodes $Q_{1-0}-Q_{54-31}$ and separating transistors $T_{1-0}-T_{54-31}$ (only a portion thereof is shown) may be constituted of elements produced by the same technology, which brings about such a great effect that integration can be easily achieved.

Figure 13:
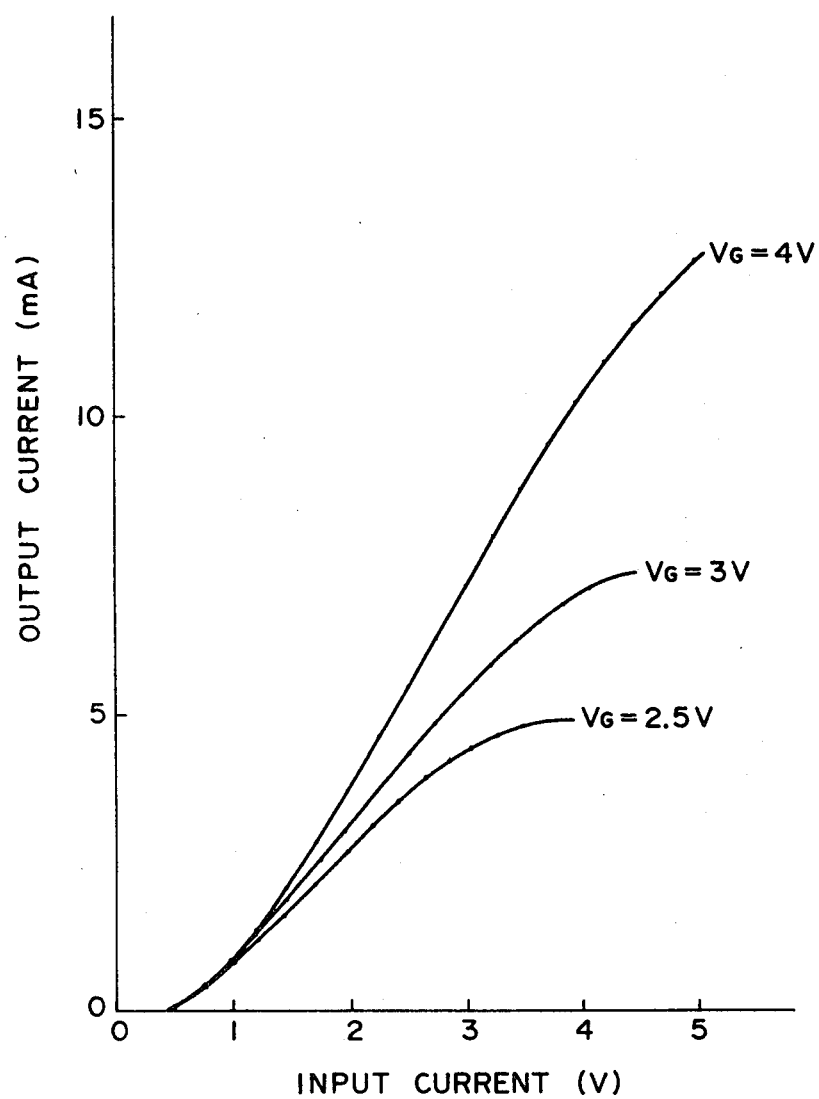
FIG. 13 shows the change in transferring characteristics corresponding to common gate bias values according to the present invention.

In particular, the embodiment shown in FIG. 12A is characterized in that the transfer characteristic can be programmed by varying a bias voltage $V_G$ supplied to the gate line common to the transistors $P_{1-0}-P_{54-31}$ for current feedback. Charge in the transfer characteristic with respect to various bias sources for the common gate is as illustrated in FIG. 13.

In the above-mentioned scanning circuit shown on the fourth to sixth embodiments, the output from the photoconductive element is always amplified (in the above embodiment, the output signal from such element is converted into a current, which is then amplified) to forward signal from the matrix wiring section. Generally, the conductivity of the photoconductive element is considerably low. Further, wide matrix wiring is required in the application of the photoelectric transducer apparatus of the invention to the elongated image-reading apparatus required for the digital copier, facsimile etc., which are the main uses of the photoelectric transducer apparatus. Therefore, it is necessary to process electric signals of very low level through the long wiring, in which case good SN ratio cannot be expected frequently. One of great features of the present invention resides in that a selection element connected with the output terminal of the photoconductive element is given an amplifying function and each element can be driven with the above-mentioned matrix wiring section being considered to be low in impedance and further a bad influence such as for example noise is decreased to a great extent.

Figure 14:
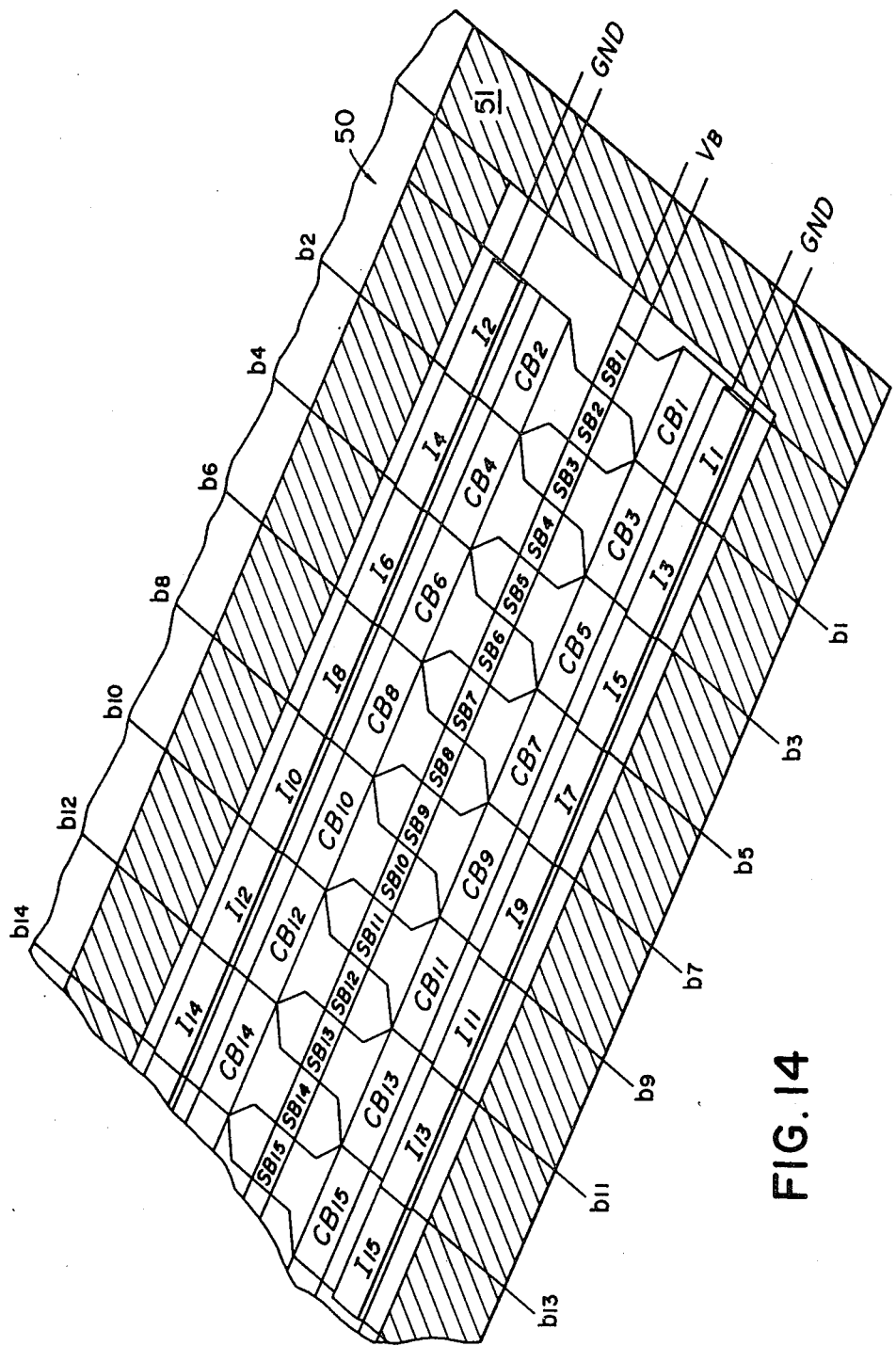

The structure of the photoelectric transducer apparatus according to the present invention will be expained with reference to FIG. 14, in which a portion of the structure is schematically shown. Photoconductive elements $SB_1-SB_{54}$ (the drawing shows partially) formed in an array on a transparent substrate 50 made of for example glass are connected with integrated scanning circuits $I_1-I_{52}$ (the drawing illustrates partially) through electrode wiring and capacitors $CB_1-CB_{54}$ (the drawing shows $CB_1-CB_{15}$) as formed on the same substrate 50 by the thin film forming technique. The connection is effected by the wire bonding method. The output lines from the scanning circuits $I_1-I_{54}$ are also connected with electrode provided on the substrate by the vapor deposition. The connection is also carried out by the wire bonding method. The output lines extend to the matrix wiring section 51 and ultimately to the output electrode. External controlling lines such as driving lines $b_1$–$b_{54}$ are connected with the substrate having thereon the scanning circuits through the electrode wiring which was provided by the vapor deposition on the substrate.

The embodiment of the structure shown in FIG. 15 is an example of the photoelectric transducer apparatus according to the invention. In this embodiment, the components in the scanning circuit shown in FIG. 10 are all mounted on a single substrate by the vacuum deposition technique. FIG. 6A is a plain view of this embodiment, and FIG. 15B is a cross-sectional view taken at the position indicated by X—X' in FIG. 15A. On the substrate 1500, there are provided a photoelectric transducer section 1501, charge storing or accumulating section 1502, selective amplifying section 1503, and discharging section 1504; and matrix wiring section, electrode for input and output of signal and electrode for supply of power source which are positioned at the right side of the drawing although those are not shown. The matrix wiring section is a general one as outlined in FIG. 7.

The individual electrode 1505 for the photoelectric transducing section is formed by vapor deposition of a transparent conductive matrial such as for example indium tin oxide (ITO) so that incidence of the light passing through the transparent substrate 1500 may be possible. Electrode 1505 is formed by vapor deposition of a light intercepting electrode material such as for example chromium (Cr) for the purpose of achieving a uniform shape of the image-element. These electrodes are fabricated independently for each image-element by the photo-etching method. A photoconductive film is further formed on the individual electrode 1505, and is provided for each image-element as of a-Si:H.

Successively, a common opposite electrode 1508 is formed by the vapor deposition and etching processes using a metallic material such as for example Al.

In the photoconductive film 1506, a P atom is dopted to form $n^+$ layers so that ohmic contact is maintained with each electrode.

The charge-storing section 1502 is constituted of a capacitor fabricated in such a manner that a thin film 1518 of $SiO_2$ or $Si_3N_4$ is formed on the light intercepting electrode by the sputtering method etc. and treated by the pattern etching method and further an earthing electrode 1509 is provided on the thin film 1518 by the thin film forming method.

The amplifying thin film transistor 1512 has the MIS (metal insulator semiconductor) structure. The electrode 1507 for light interception supplies potential generated due to the charges stored in the charge-storing section 1502 to the gate of the transistor 1512 with the MIS structure.

In the selective drain electrode portion 1511 of the transistor 1512, the $n^+$ layer is removed by utilizing dependence of the etching rate for the Si thin film upon the doping concentration of P atom. The drain selective electrode 1510 is composed of a metal material such as for example Al. As a result, a Schottky barrier diode having a function of the separation diode as indicated by $R_{1\text{-}0}$–$R_{54\text{-}31}$ in FIG. 10 is formed. In the part between the electrode 1512 at the source side and semi-conductor film 1514, the $n^+$ layer remains to maintain the ohmic contact. An insulating layer 1519 is composed of an insulating film such as $SiO_2$ and the like. Such insulating layer is formed, particularly for the purpose of decreasing the capacitive coupling between the selective drain electrode 1510 and light intercepting electrode 1507 which is an output line from the photoelectric transducing section.

The diode constituting the discharge section 1504, which comprises a Schottky barrier, maintains the ohmic contact with a common opposite electrode 1508 which works for a discharge controlling electrode by way of $n^+$ layer, and maintains a Schottky contact with a light intercepting electrode 1507 to form a Schottky diode against a light intercepting electrode as anode.

An optoelectric transducer shown in FIGS. 16A and 16B shows an embodiment in which resistances $F_{1\text{-}0}$–$F_{54\text{-}31}$ for current feedback shown in FIG. 11 are inserted. FIG. 1B shows a cross section taken on line X—X' of plan view FIG. 16A. The arrangement of members is similar to that of FIG. 15 except that resistances 1600 are disposed. The resistances may be made of a-Si doped with a suitable amount of doping agent, or suitable metal oxide, boride, nitride, and the like.

In FIG. 16B, reference numeral 1601 represents an opticalelectric transducer section, 1602 charge accumulating section, 1603 amplifier section, and 1604 discharging section.

Figure 17A:
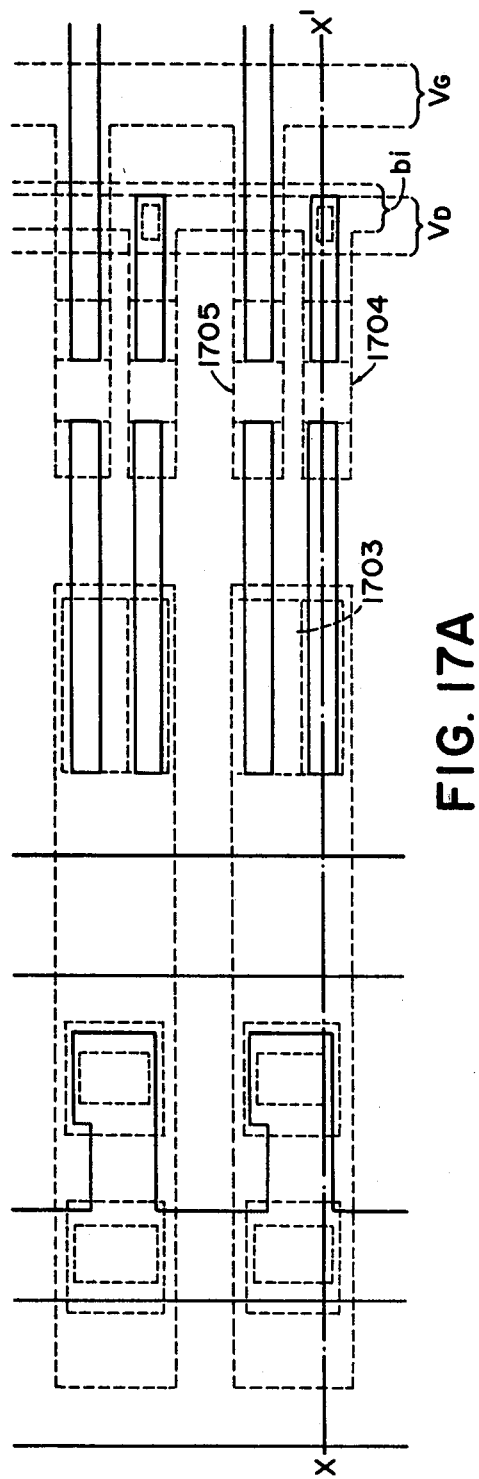
Figure 17B:
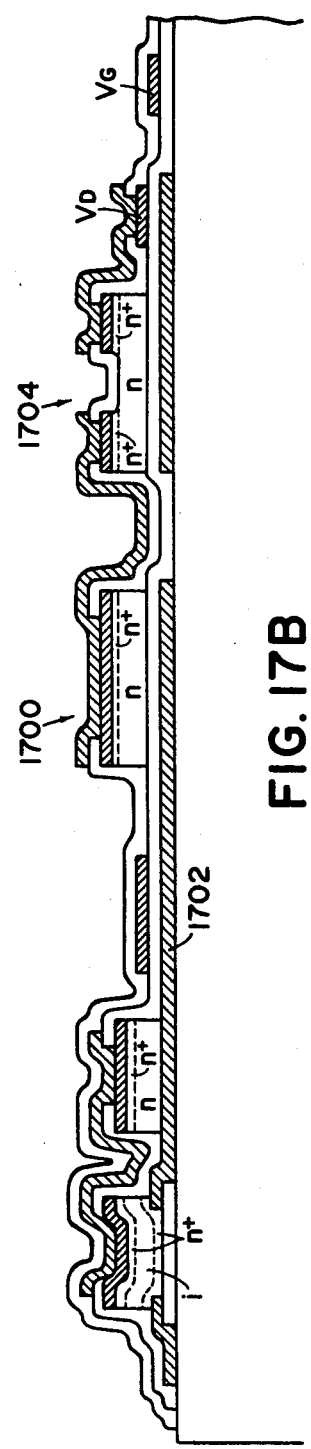

FIGS. 17A and 17B shows an embodiment in which MIS transistors as elements for current feedback and as separating elements are prepared with thin film. FIG. 17B shows a sectional view taken an line X—X' of plan view FIG. 17A. A scanning circuit corresponding to FIGS. 17A and 17B has already been discribed in FIG. 12A. This embodiment differs from that in FIGS. 15A and 15B in points that channel 1703 of MIS transistor 1700 as a separatable amplifying element is disposed in parallel with intercepting electrode 1700, and transistor 1704 for separation and transistor 1705 for current feedback are independently set.

MIS transistor 1512 for amplifying of FIG. 15 differs from 904 in a point that MIS transistor drain 904 is designed so as to be kept in ohmic contact with an electrode metal. It is added as a supplement description that a MIS transistor gate for separation is used in common with input line 902 of selecting signal line bi, and the power source line of the MIS transistor for separation is used in common with that $V_D$ for transistor.

Figure 18:
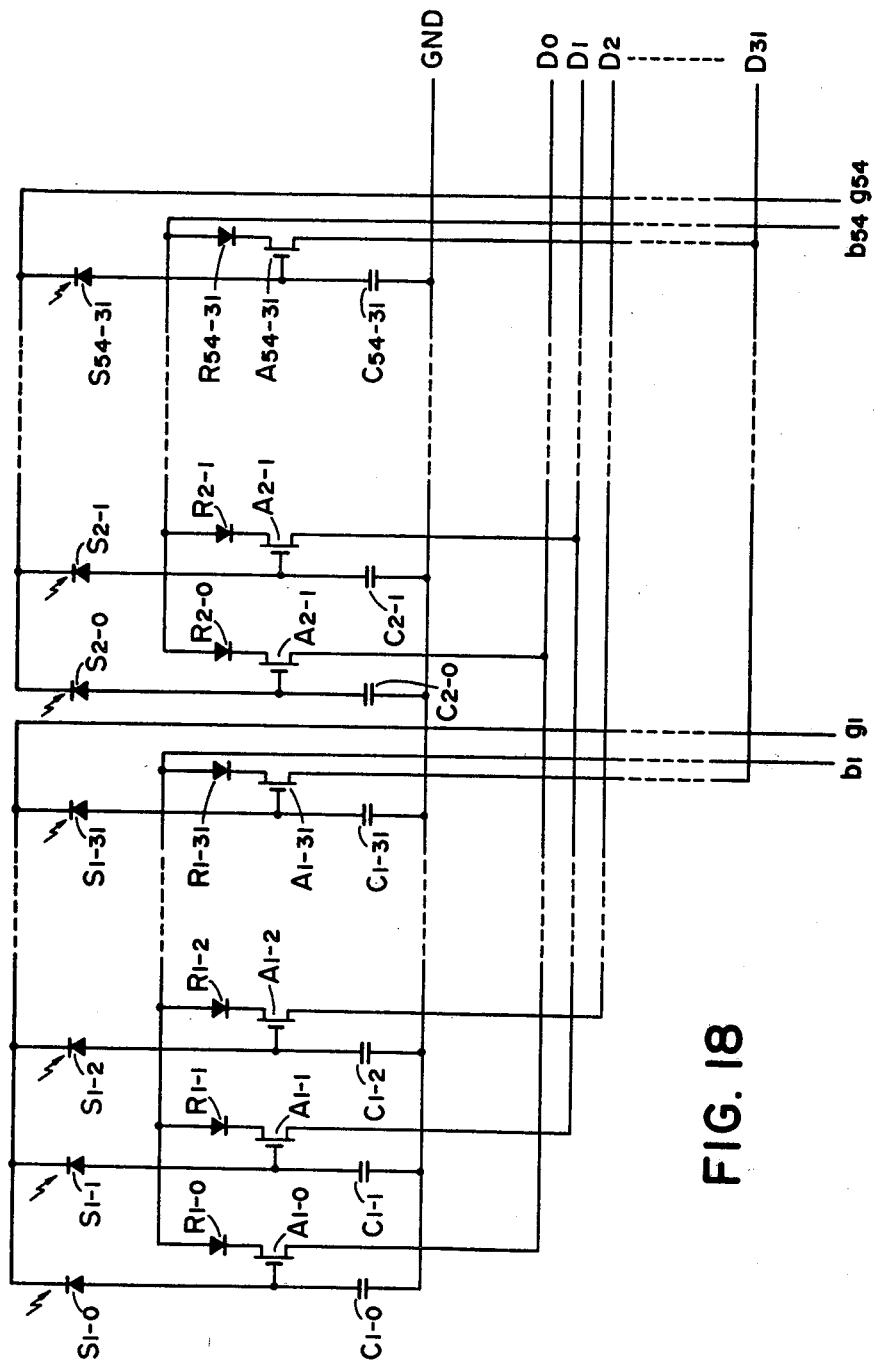
FIGS. 18, 19, 20A and 20B are scanning circuits for explaining embodiments of the present invention.

FIG. 18 shows the scanning circuit of a seventh embodiment of the present invention. 1728 ($=54\times32$) optoelectric converter elements $S_{1\text{-}0}$–$S_{54\text{-}31}$, which are required for realizing image reading at a density of about 8 image-elements/mm in the short direction of A4 size manuscript, are fed from limit lines $g_1$–$g_{54}$. Accordingly, charge-storing capacitors $C_{1\text{-}0}$ to $C_{54\text{-}31}$ store or accumulate charges at a rate in accordance with the quantity of the incident light on the respective photoelectric converter elements. Thus, the potential at the connection point of the capacitors $C_{1\text{-}0}$–$C_{54\text{-}31}$ and the gates of selective amplifying MOS transistors $A_{1\text{-}0}$–$A_{54\text{-}31}$ is a value corresponding to the incident light quantity during a certain charge-storing period of time. In the scanning circuit of this embodiment, the charge-storing capacitor is expected to have effect as a low-pass filter together with the photoelectric converter element from an aspect of the circuit. If a voltage is applied exclusively to the wiring at the drain side common to 32 amplifying MOS transistors, for example a block driving line $b_1$, the amplifying MOS (or MIS) transistors $A_{1\text{-}0}$–$A_{1\text{-}31}$ are biased in accordance with the potential of the above-mentioned connection point, and each amplifying MOS (or MIS) transistor has a channel resistance corresponding to the quantity of the incident light on the photoelectric converter element connected therewith. Signal current in response to the quantity of the incident light on the photoelectric converter elements $S_{1\text{-}0}$–$S_{1\text{-}31}$ is automatically output to individual data lines $D_0$–$D_{31}$. It is clear that the data lines $D_0$––$D_{31}$ should be connected with an input circuit of low impedance such as a current amplifier etc. for the purpose of securing the above-mentioned operation. Diodes $R_{1\text{-}0}$–$R_{54\text{-}31}$ for current separation are disposed to ensure signal separation between the amplifying MOS (or MIS) transistors connected with the data lines $D_0$–$D_{31}$, particularly at the time of non-selection.

Successively, while an electrical potential are exclusively supplied to $b_2$ for selecting output from the second photoelectric converter element group $S_{2\text{-}0}$–$S_{2\text{-}31}$, charge accumulated in capacitors $C_{1\text{-}0}$–$C_{1\text{-}31}$ for charge accumulation is discharged through diodes by feeding potential to controlling line $g_1$ so as to make forward bias on photoelectric converter element group $S_{1\text{-}0}$–$S_{1\text{-}31}$ having diode structure. After completion of the discharge, when a potential is applied so as to reversely bias the diode, each capacitor starts to accumulate charge with corresponding rate to an incidental light quantity to each photoconductor element.

Figure 19:
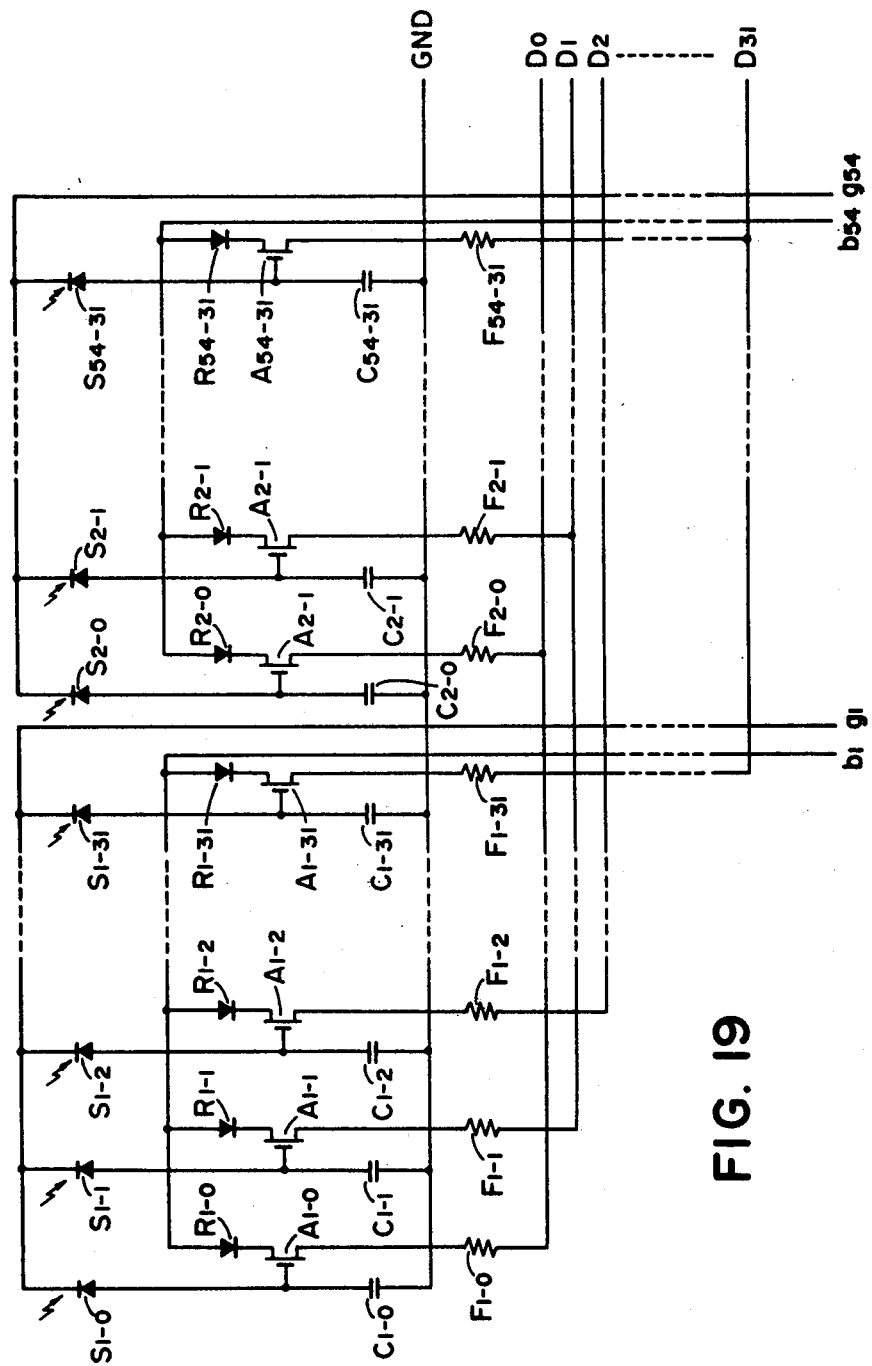

FIG. 19 illustrates a scanning circuit which is the scanning circuit of an eighth embodiment of the invention. The seventh embodiment shown in FIG. 18 can be expected to attain sufficient technical effect when high accuracy in reading for the quantity of the incident light is not required, or when the amplifying transistors are low in the transfer characteristics, particularly in the distribution of the threshold voltage with respect to the same lot produce. Further, this embodiment is simple in the circuit structure. However, the distribution of the transfer characteristics becomes problematic in some cases, for example when particularly high accuracy is required in reading information of the light quantity. For the purpose of resolving such problem, the second embodiment shown in FIG. 19 is an example for realizing uniform transfer characteristic as a whole by connecting each source of the amplifying transistors $A_{1\text{-}0}$–$A_{54\text{-}31}$ with a resistor and utilizing the current feedback. The circuit operation will be made clear from the explanation in connection with the scanning circuit of FIG. 18 if it is understood that negative feedback utilizing the current feedback is applied to the operation of the amplifying transistors $A_{1\text{-}0}$–$A_{54\text{-}31}$.

Figure 20A:
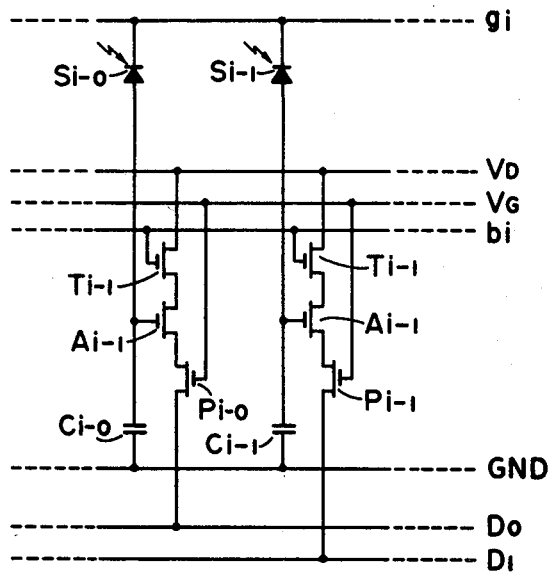
Figure 20B:
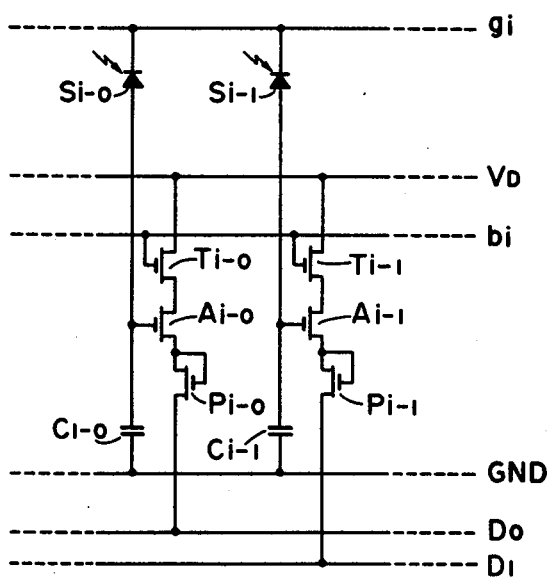

A still further scanning circuit which is the ninth embodiment of the invention is illustrated in FIG. 20A, while its modification is shown in FIG. 20B. In these embodiments, nonlinear operating elements $P_{1\text{-}0}$–$P_{54\text{-}31}$ (only portion of the elements is shown) are used as the elements for realizing the above-mentioned current feedback in place of the resistors, and MOS (or MIS) transistors $T_{1\text{-}0}$–$T_{54\text{-}31}$ (only a portion thereof is shown) are employed as the separation means from the common line at the drain side of the amplifying transistors $A_{1\text{-}0}$–$A_{54\text{-}31}$. Particularly, the amplifying transistors $A_{1\text{-}0}$–$A_{54\text{-}31}$ (only a portion thereof is shown), transistors $P_{1\text{-}0}$–$P_{54\text{-}31}$ for current feedback (only a portion thereof is shown) and separating transistors $T_{1\text{-}0}$–$T_{54\text{-}31}$ (only a portion thereof is shown) may be constituted of elements produced by the same technology, which brings about such a great effect that integration can be easily achieved.

Figure 21:
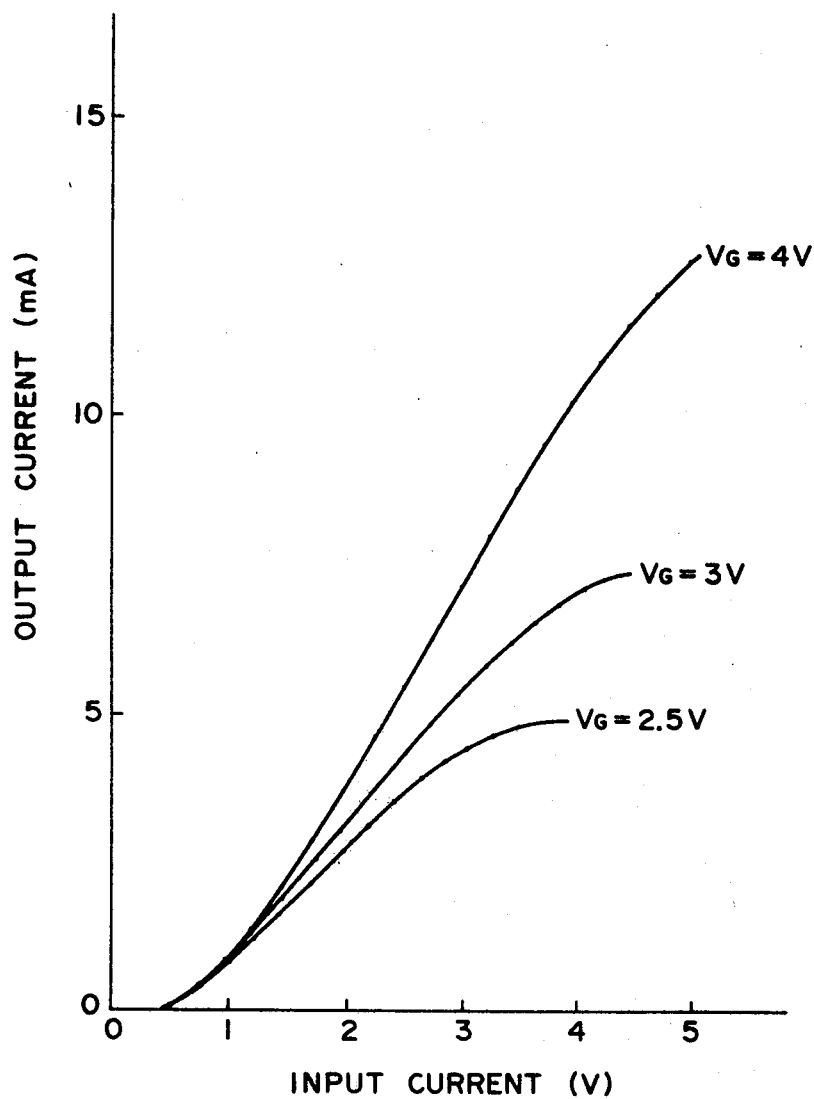
FIG. 21 shows the change in transferring characteristics corresponding to common gate bias value according to the present invention.

In particular, the embodiment shown in FIG. 20A is characterized in that the composite transfer characteristic can be programmed by varying a voltage supplied from bias power source to the common gate of the transistors $P_{1\text{-}10}$–$P_{54\text{-}31}$ for current feedback change in the transfer characteristic with respect to various values for the common gate is as illustrated in FIG. 21.

Figure 22:
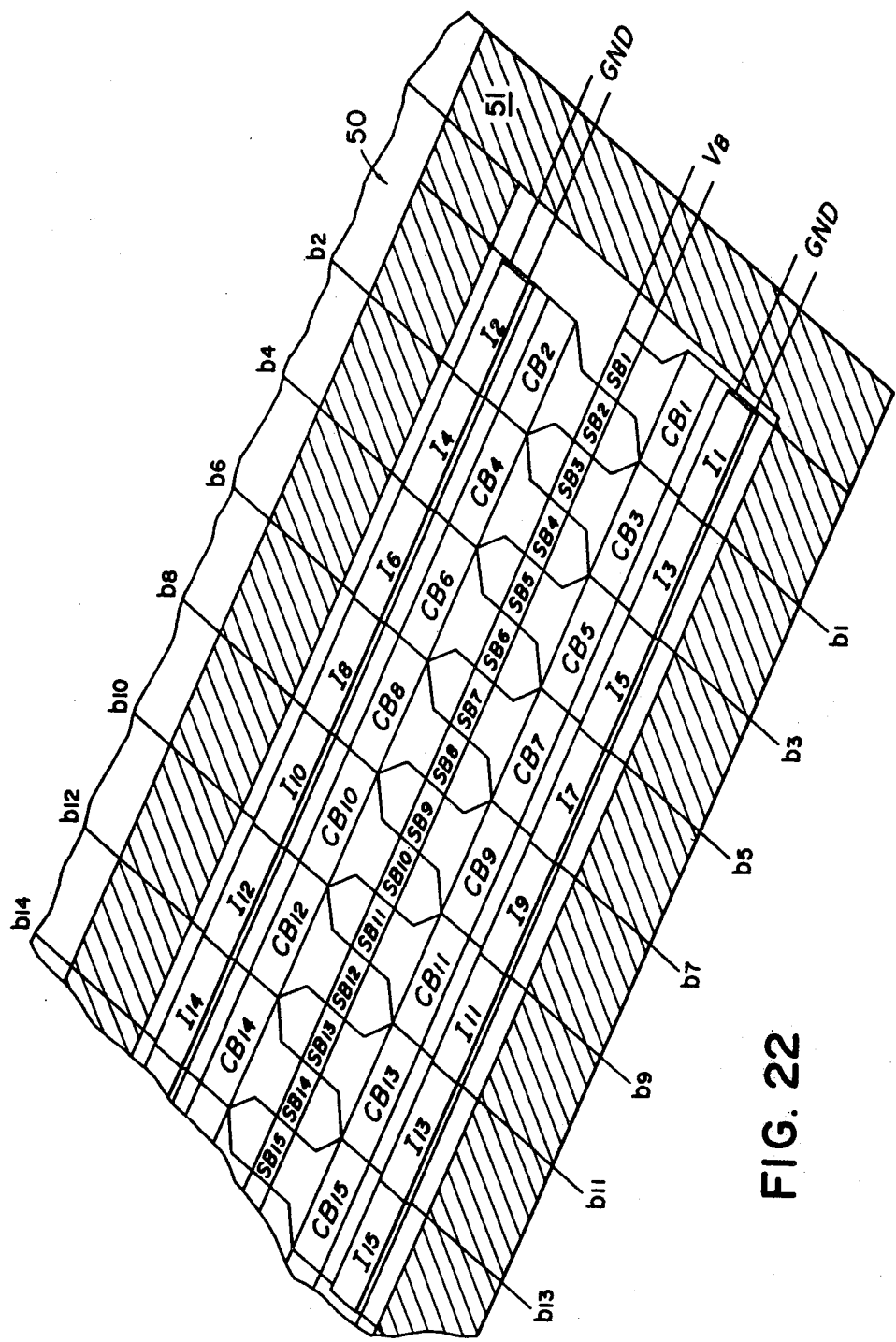

FIG. 22 schematically shows the construction of a photoelectric transducer apparatus. A photoelectric transducer element group (the element construction will be explained below) $SB_1$–$SB_{54}$ (only a part of them is shown) is provided on a transparent substrate 50 such as glass and the like in a line. Said element group is connected, by wire bonding, to scanning circuit substrates $I_1$–$I_{54}$ (only a part of them is shown) integrated through electrode wiring and capacitor group $CB_1$–$CB_{54}$ (only a part of them is shown) formed on the same substrate by a thin film forming technique.

Output lines from scanning circuit $I_1$–$I_{54}$ (partly shown) are also connected to electrodes vapor-deposited on the substrate by means of wire bonding and led to a matrix wiring portion 51 and finally to an electrode for output.

External control wires such as driving wires $b_1$–$b_{54}$ and the like are also led to scanning circuit $I_1$–$I_{54}$ through an electrode wiring formed by vapor deposition. The photoelectric transducer of a hybrid construction of the present embodiment has the same construction as the photoelectric transducer of monolithic structure shown in the following embodiment, and therefore, it will be explained there in detail.

Referring to FIG. 23, the embodiment is that of a photoelectric transducer apparatus of the present invention where all the scanning circuit as shown in FIG. 18 are produced on one sheet of a substrate by vapor-deposition technique.

Figure 7:
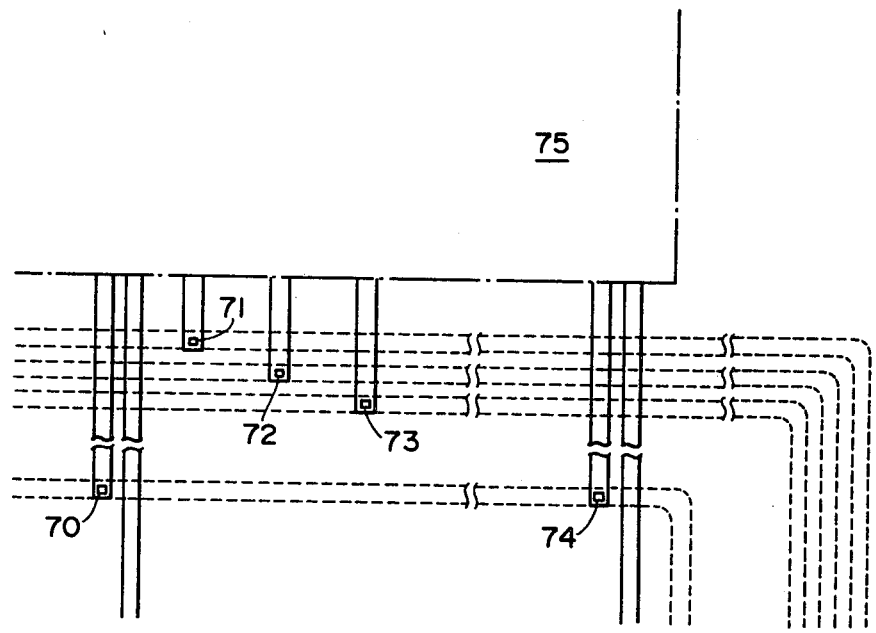
FIG. 7 is a drawing for explaining the matrix wiring portion in the present invention.

FIG. 23A is a plane view while FIG. 23B is a cross sectional view taken along a line X—X' in FIG. 23A. On a substrate 2300, there are disposed a photoelectric transducer portion 2301, a charge storage portion 2302, a selectable amplifying portion 2303, a matrix wiring portion (not shown) at the right side portion of said figure, electrode for input and output of signals, and electrode for power supply. The matrix wiring portion is a generally used on as schematically shown in FIG. 7.

Individual electrode 2314 of photoelectric transducer portion 2301 is made of a transparent electroconductive material such as indium tin oxide (ITO) and the like produced by vapor-deposition so that a light passing through the transparent substrate 2300 may pass through. Around said electrode 2314 there is formed an intercepting electrode 2307 of chromium or the like by means of vapor deposition and photoetching so as to make the shape of picture elements uniform, and the intercepting electrode is independently formed for each picture element.

Further on the individual electrode 2314 there are laminated p-type a-Si film, i-type a-Si film, and n-type a-Si film to produce a semiconductor film 2315 of a p-i-n structure. On the n-type a-Si film there are an upper electrode 2316 composed of a metal such as aluminum and the like, and a discharge controlling electrode wire 2308 (corresponding to $g_1$–$g_{54}$) which is connected to said electrode 2316 and is composed of a metal material such as aluminum produced by a thin film technique.

Between the n-type a-Si film and the upper electrode 2316 there is an $n^+$ layer which contacts them as an ohmic contact.

The charge storage portion 2302 is composed of a capacitor produced by forming a deposited thin film of $SiO_2$ or $Si_3N_4$ by means of sputtering or the like, pattern-etching said thin film to form an insulating film 2318 on the electrode 2307 and then forming an earth electrode 2309 by means of a thin film technique.

A thin film transistor for amplification 2312 has an MIS (metal-insulating material-semiconductor) structure. Electrode for light interception 2307 supplies a voltage produced by electric charge stored in charge storage portion 2302 to the gate of said MIS structure transistor 2312.

In a drain electrode for selection 2311 of a transistor 2312 there is utilized the fact that the etching speed of Si thin film depends on the concentration of P atom for doping, and an $n^+$ layer is omitted. As a material for drain electrode 2311, a metal such as Au and the like is used to form Schottky barrier diodes which function as separation diodes designated as $R_{1-10}$–$R_{54-31}$ in FIG. 18. Under source side electrode 2313 there remains an $n^+$ layer 2317 and an ohmic contact is retained. An insulating layer 2319 is made of an insulating material such as $Si_3N_4$ film, $SiO_2$ film formed by sputtering and the like, in particular, so as to reduce the electrostatic bonding between the selection electrode 2310 and the light intercepting electrode 2307 which is an output line from the photoelectric transducer portion.

Figure 24A:
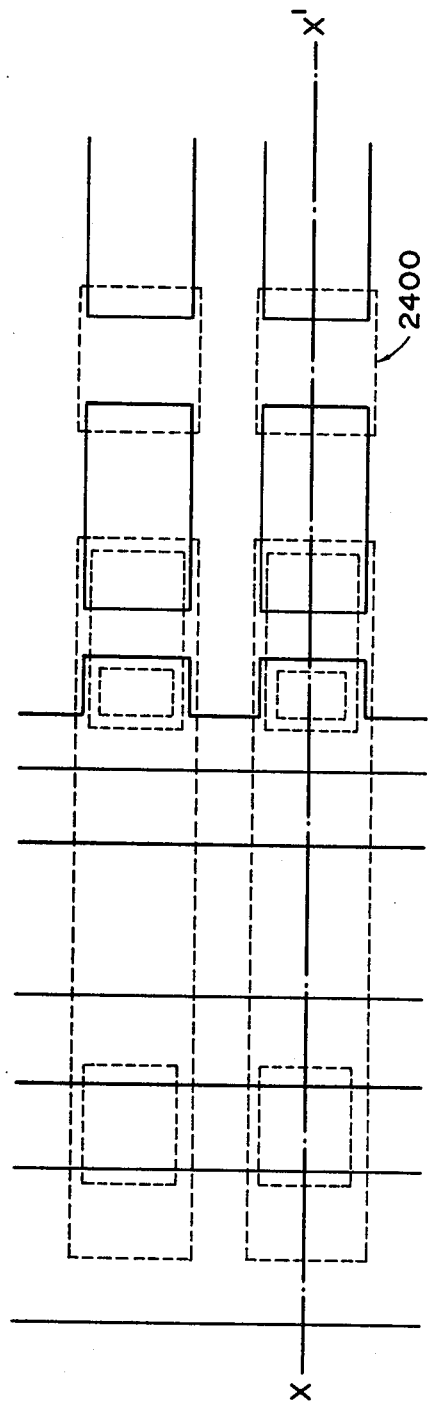
Figure 24B:
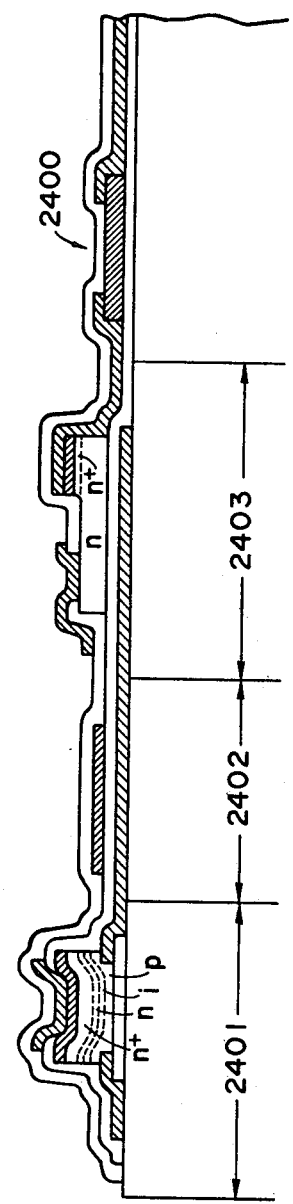

The embodiment as illustrated in FIG. 24A, a plane view, and FIG. 24B, a cross sectional view taken along a line X—X' of FIG. 24A, contains resistors $F_{1-0}$–$F_{54-31}$ for current feedback as shown in FIG. 19. The arrangement of the members is almost the same as that in FIG. 23. The difference is that a resistor 2400 is provided, and the resistor may be produced by using an a-Si doped with an appropriate amount of dopant, or by using a metal oxide, a metal boride, a metal nitride or the like.

In FIG. 24, 2401 denotes a photoelectric transducer portion, 2402 a charge storage portion, and 2403 a selectable amplifying portion.

In FIGS. 25A and B, there is shown an embodiment that an MIS transistor as a current feedback element and an MIS transistor as a signal separating element are fabricated by a thin film technique. FIG. 25A is a plane view and FIG. 25B is a cross section taken along a line X—X'. The performance of the corresponding scanning circuit has been already explained in FIG. 20A. In the present embodiment, the difference from the arrangement in FIG. 23 resides in that a channel 2503 of MIS transistor 2500 as a selectable amplifying element is disposed in parallel to a light intercepting electrode 2504, and a transistor for separation 2501 and transistor for current feedback 2502 are independently disposed.

Figure 26:
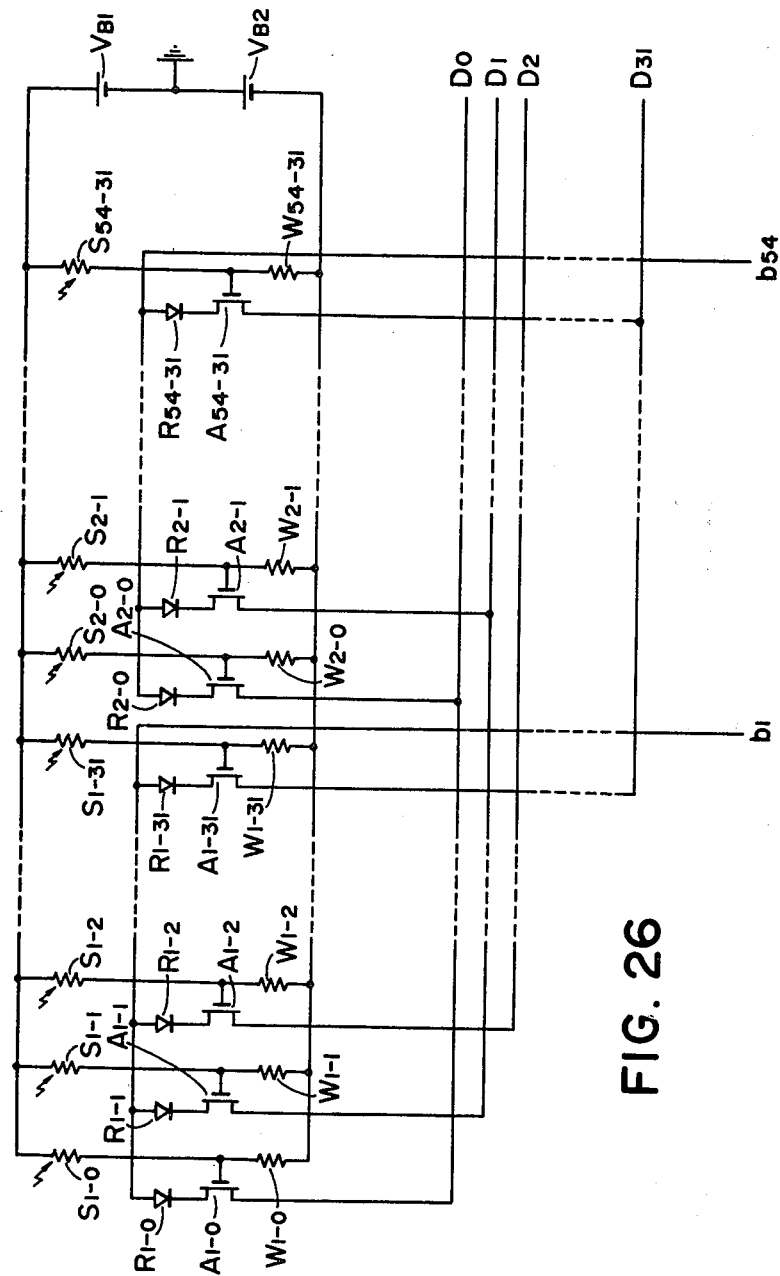
FIGS. 26, 27, 28A and 28B show scanning circuits for explaining those in embodiments of the present invention.

FIG. 26 illustrates a scanning circuit of the 10th embodiment. Electric power is supplied by an external power source $V_{B1}$ to photoconductive elements $S_{1-0}$–$S_{54-31}$ of 1728 pieces (54×32) necessary for reading images of a density of about 8 picture elements along the short side of A4 paper. Electric power is supplied by an external bias power source $V_{B2}$ to compensation elements $W_{1-0}$–$W_{54-31}$ which compensate for change of the above mentioned photoconductive elements and are made of the same material as that of the photoconductive elements or have the same environmental characteristics (e.g. temperature and humidity). Therefore, the connection point potential between the photoconductive element and the compensation element corresponds to the incident light amount and assumes a value compensating for the environmental conditions.

When a voltage is exclusively applied to a drain side wiring such as block driving wire common to a group of 32 lines of selectable MOS (or MIS) transistor for amplification $A_{1-0}$–$A_{54-31}$, the MOS (or MIS) transistor for amplification is biased corresponding to the potential of the above mentioned connection point, and each MOS (or MIS) transistor for amplification has a channel resistance corresponding to a light amount incident upon the photoconductive element connected to each MOS transistor. Therefore, a signal current corresponding to a light amount incident upon a photoconductive element $S_{1-0}$–$S_{1-31}$ is automatically applied to individual data line $D_0$–$D_{31}$. It is clear that, for the purpose of assuring the above mentioned operation, individual data lines $D_0$–$D_{31}$ are to be connected to a low impedance input circuit such as current amplifier and the like. Here, diodes for current separation $R_{1-0}$–$R_{54-31}$ are provided so as to assure signal separation between MOS (or MIS) transistors for amplification connected to individual data lines, in particular, upon non-selection.

If selectable amplifying elements $A_{1-0}$–$A_{54-31}$ have the same environmental characteristics (mainly, transistor threshold voltage and the like) as the photoconductive elements or compensation elements, or have environmental characteristics similar to those elements, it is clear that the environmental characteristics of the amplifying elements can be compensated by appropriately selecting the values of $V_{B1}$ and $V_{B2}$. In particular, the effect is very large where amplifying elements, photoconductive elements and compensation elements are produced by the same technology.

Figure 27:
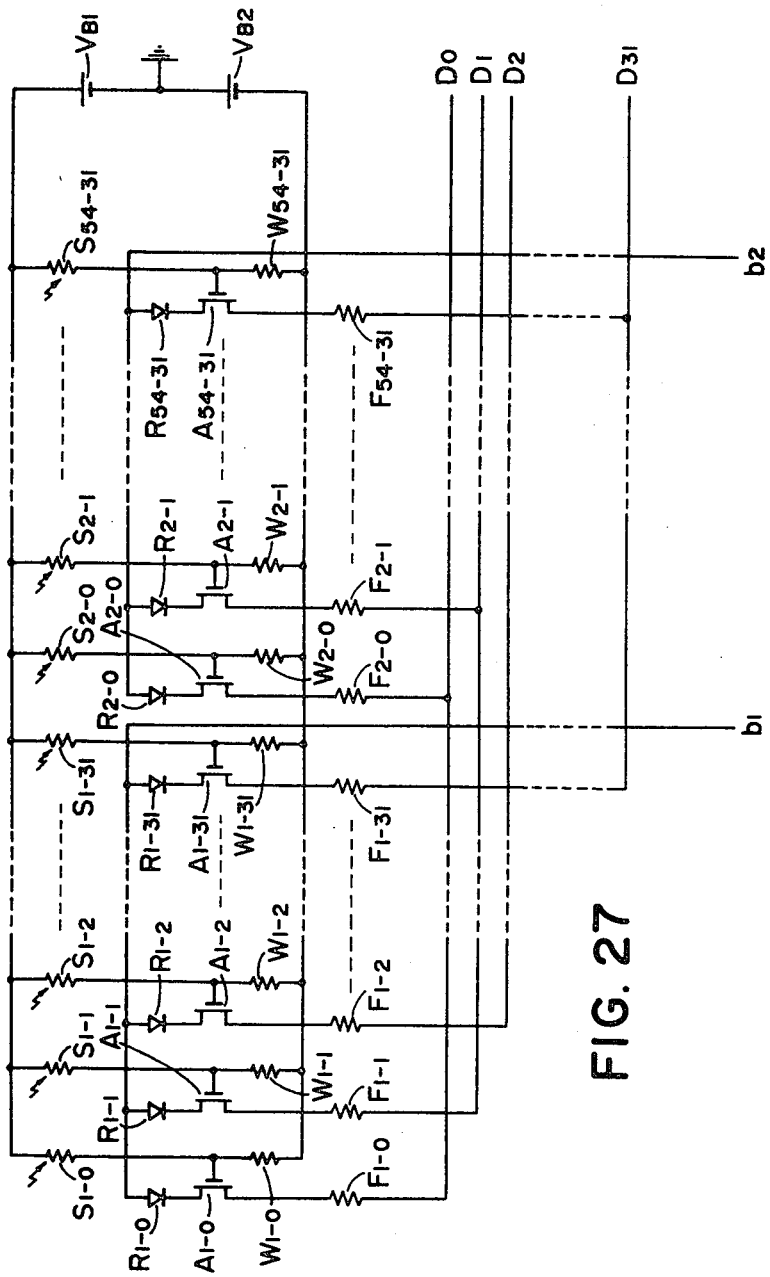

FIG. 27 illustrates a scanning circuit of the 11th embodiment. A sufficient effect of the tenth embodiment illustrated in FIG. 26 can be expected when a high accuracy of reading-out of the incident light amount is not requested or the transistors used for amplification are produced in the same lot and the transferring characteristics, in particular, threshold voltages, are not so different from one another. And further, the circuit is simple. However, when the light amount information is to be read out at a particularly high accuracy, the distribution of the above mentioned transferring characteristics becomes a problem sometimes.

The embodiment in FIG. 27 shows that, for the purpose of solving the abovementioned problem, resistors $F_{1-0}$–$F_{54-31}$ are inserted to the source circuits of transistors for amplification $A_{1-0}$–$A_{54-31}$ and composite transferring characteristics are made uniform by current feedback. The circuit operation will be clear from the explanation about the tenth scanning circuit in FIG. 26 if it is understood that a negative feedback utilizing a current feedback acts on operation of a transistor for amplification.

Figure 28A:
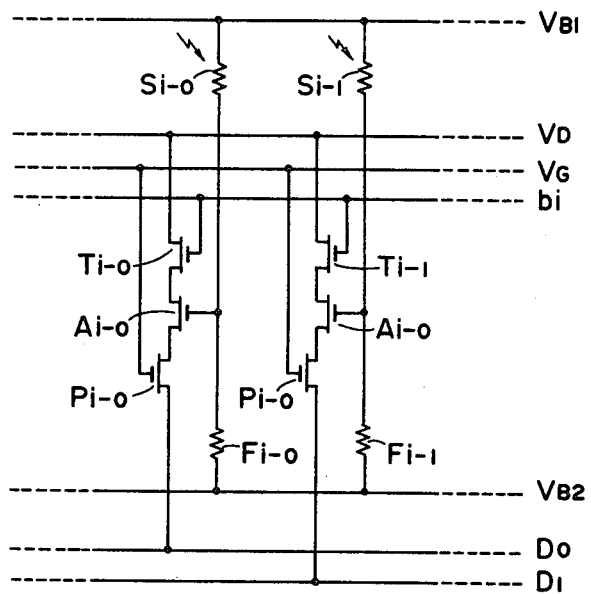
Figure 28B:
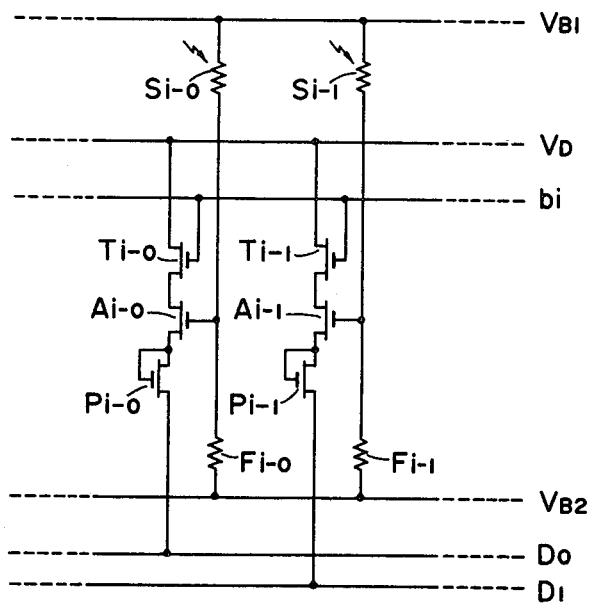

The 12th embodiment of a scanning circuit according to the present invention is shown in FIG. 28A and its modification is shown in FIG. 28B. In the embodiment, as an element for effecting the above mentioned current feedback, non-linear operation elements, that is, transistors $P_{1-0}$–$P_{54-31}$ (partly shown), are used in place of resistors. As a means for separation from common lines at the drain side of transistors for amplification $A_{1-0}$–$A_{54-31}$, there are used MOS (or MIS) transistors $T_{1-0}$–$T_{54-31}$. In particular, there is a very good effect that transistors for current feedback $P_{1-0}$–$P_{54-31}$, transistors for amplification $A_{1-0}$–$A_{54-31}$ and transistors for separation $T_{1-0}$–$T_{54-31}$ are constructed by elements capable of being produced by one and the same technology and thereby can be easily integrated.

In addition, in the case of FIG. 28A, composite transferring characteristics can be programed by changing a voltage from bias power source $V_G$ applied to common gates for transistors for current feedback.

Figure 29:
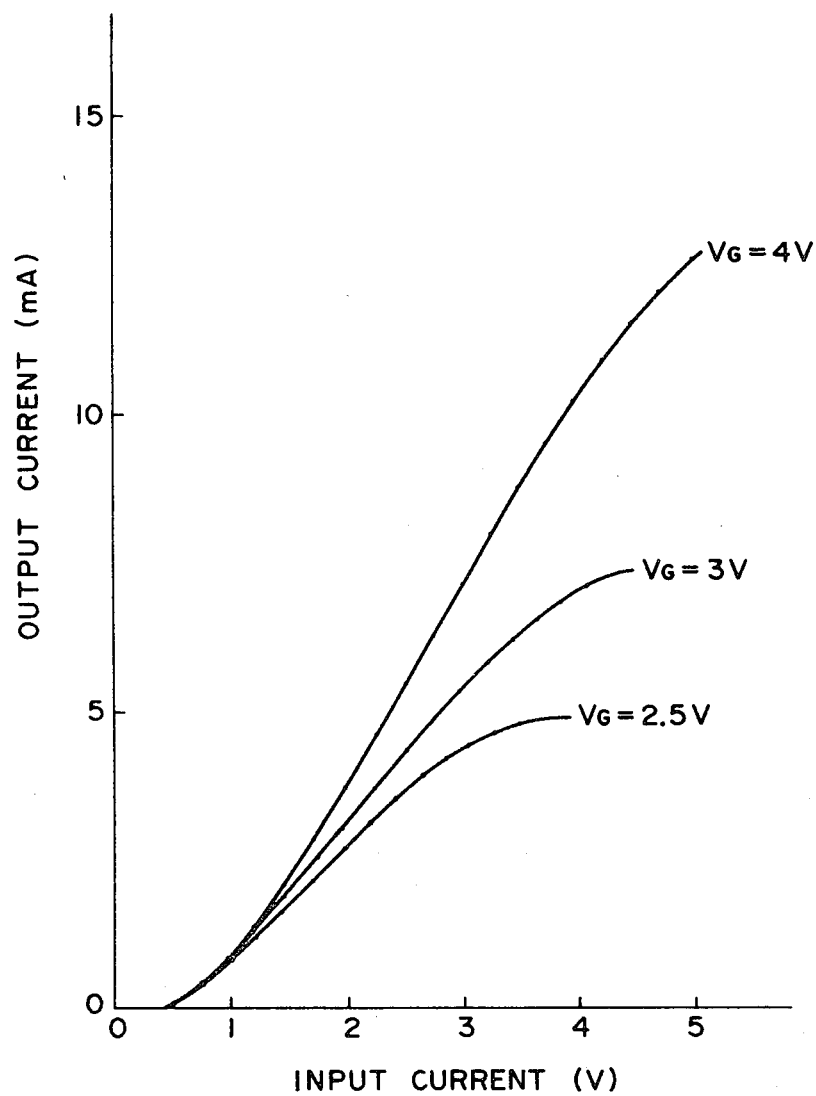
FIG. 29 shows the change in transferring characteristics corresponding to common gate bias values in the present invention.

FIG. 29 shows variation of transferring characteristics for various common gate bias values.

Figure 30:
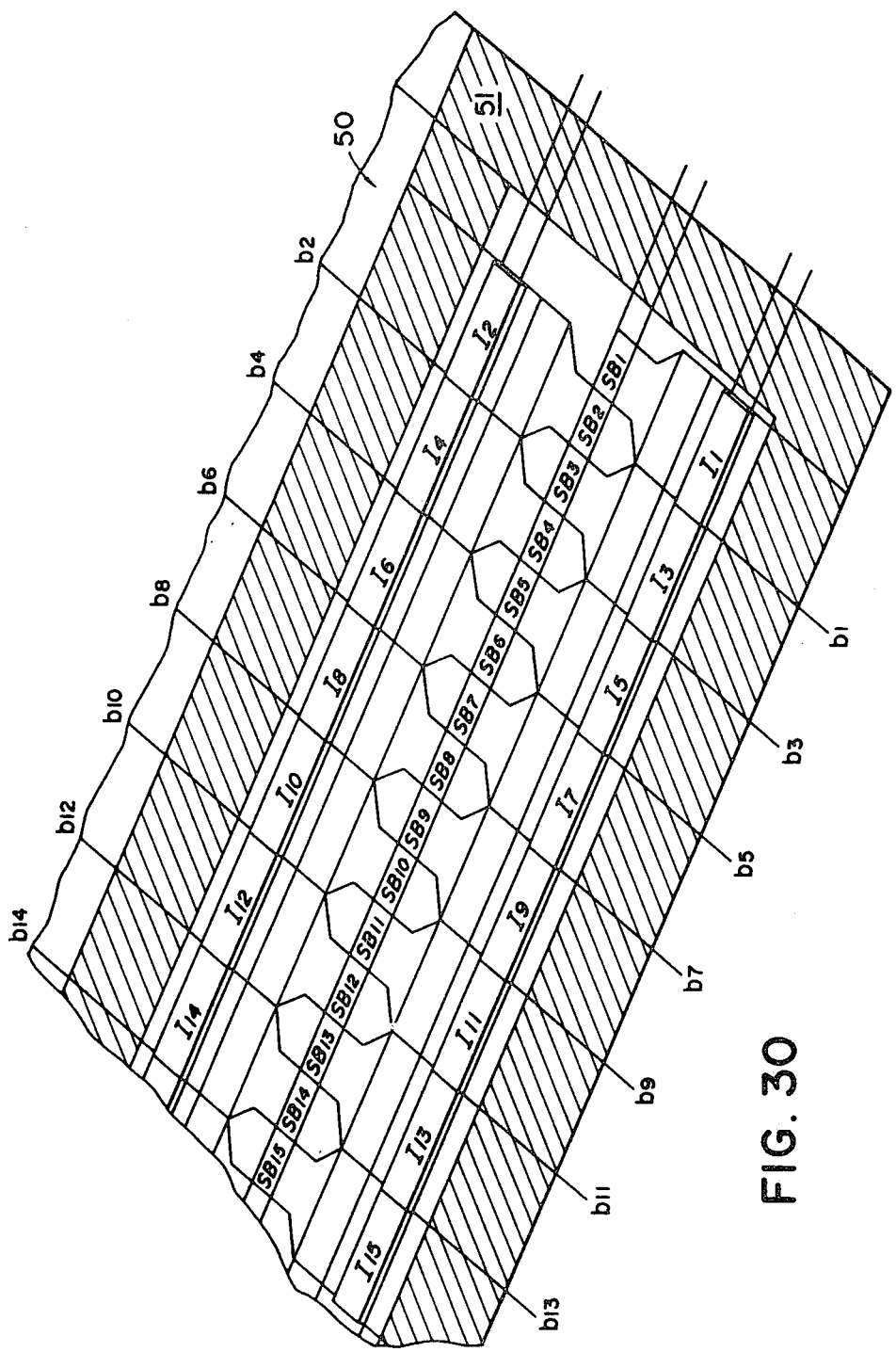
FIGS. 30, 31A and 31B explain embodiments of the present invention, where

FIG. 30 schematically shows a construction of a photoelectric transducer according to the present invention.

A group of photoconductive elements $SB_1$–$SB_{54}$ (the element structure will be explained below formed on a transparent substrate 50 in a row are connected to scanning circuit $I_1$–$I_{52}$ (partly shown) by means of wire bonding. The scanning circuit is integrated through electrode wiring formed on the same substrate by means of thin film technology.

Output lines from the scanning circuit $I_1$–$I_{54}$ are also connected to electrodes vapor-deposited on substrate 50 by wire bonding, led to matrix wiring portion 51 and finally connected to output electrode.

External controlling wires such as driving wires $b_1$–$b_{54}$ are also led to scanning circuit $I_1$–$I_{54}$ through vapor-deposited thin film electrode wiring on substrate 50.

Figure 31A:
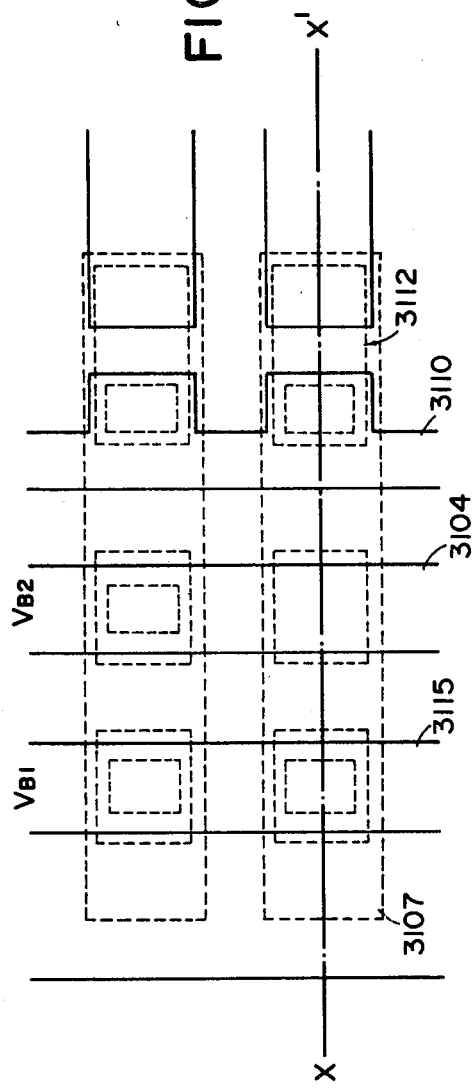
Figure 31B:
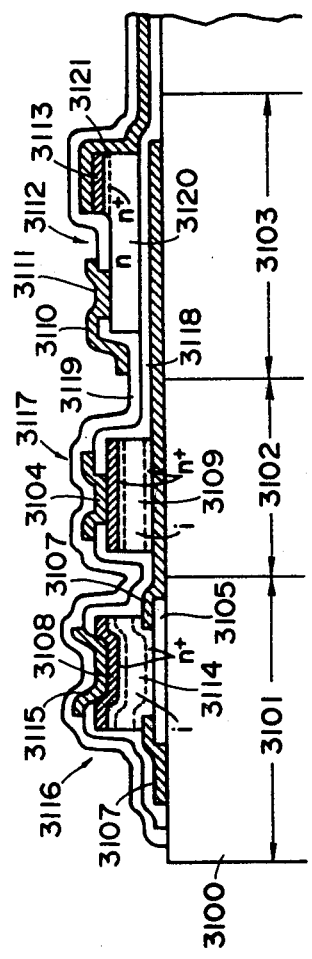

FIG. 31 shows an embodiment of a photoelectric transducer according to the present invention where the scanning circuit illustrated in FIG. 26 is all produced on one sheet of substrate of thin film technique. FIG. 31A is a plane view, and FIG. 31B is a cross sectional view taken along a line X—X' in FIG. 31A. On substrate 3100 are formed photoelectric transducer portion 3101, compensation element portion 3102, selectable amplifying portion 3103, and matrix wiring portion at the right side of the drawing, electrode portions for signal input and output, and electrode portions for power supply (not shown). The matrix wiring portion is a usual one as schematically shown in FIG. 7.

Individual electrode 3105 of photoelectric transducer portion 3101 is made of a transparent electroconductive material such as indium tin oxide (ITO) and the like so that a light passing through transparent substrate 3100 can pass through. Said ITO may be vapor-deposited. Around the electrode 3105 there is independently formed light intercepting electrode 3107 made of chromium or the like by vapor-deposition and photoetching for each picture element so as to produce a uniform shape of picture element.

Further, on the individual electrode 3105 is formed a semiconductor film 3114 of a p-i-n structure which is produced by laminating a p-type a-Si film, an i-type a-Si film and an n-type a-Si film.

On the n-type a-Si film are formed an upper electrode 3108 made of a metal such as aluminum and the like and a discharge controlling electrode wire 3115 (corresponding to $g_1$–$g_{54}$) made of a metal such as aluminum and the like which is connected to said electrode 3108. Between the n-type a-Si film and the upper electrode 3108, there is formed an n+ layer which has ohmic contact with them.

Each element 3117 in a compensation element portion 3102 is produced simultaneously with production of each element 3116 in photoconductive element portion 3101. Compensation element 3117 has a light intercepting electrode 3107 in place of a transparent electrode for incident light in said element 3116. This point is different from photoconductive element 3116. Therefore, as mentioned above, dark current common to both elements and particularly sensitive to temperature can be cancelled by supplying voltage to bias voltage supplying lines 3115 and 3104 from power sources $V_{B1}$ and $V_{B2}$ such that the voltage value is of the opposite polarity and has the same absolute value. Compensation of transferring characteristics of MIS structure transistor 3112 for amplification is possible by balancing both elements accordingly.

In a drain electrode for selection 3111 of a transistor 3112 there is utilized the fact that the etching speed of Si thin film depends on the concentration of P atom for doping, and an n+ layer is omitted. As a material for a drain electrode, there is used a metal such as Au and the like, and drain electrode 3111 and semiconductor layer 3120 form a Schottky barrier diode which functions as a separation diode designated as $R_{1-0}$–$R_{54-31}$ in FIG. 26.

At a contact portion between a source side electrode 3113 and an n-type semiconductor layer 3120, there remains an n+ layer 3121 and an ohmic contact is retained. An insulating layer 3119 is made of an insulating material such as $Si_3N_4$ film, $SiO_2$ film formed by sputtering and the like, in particular, so as to reduce the electrostatic bonding between the selection electrode 3110 and the light intercepting electrode 3107 which is an output line from the photoelectric transducer portion.

Figure 32A:
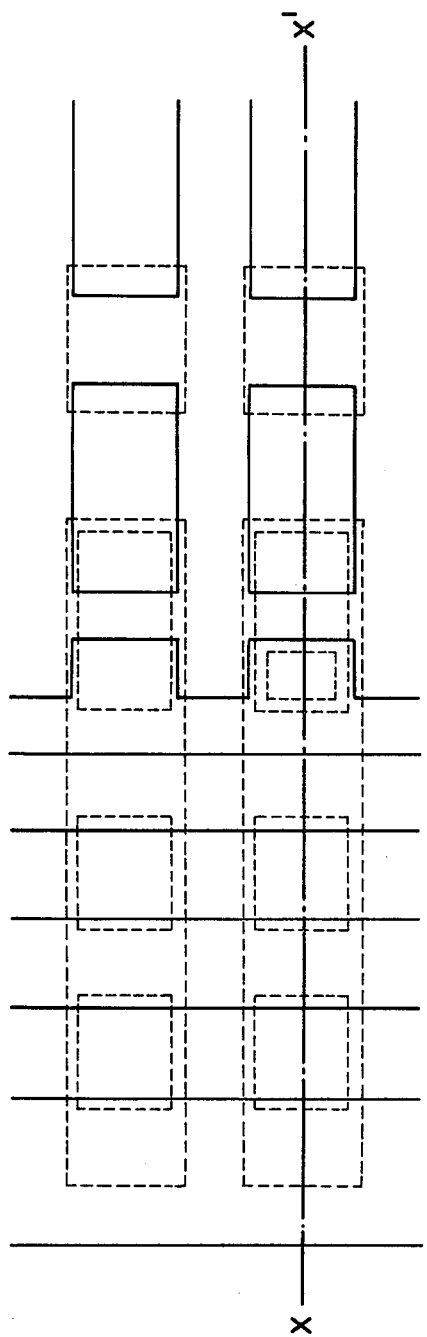
Figure 32B:
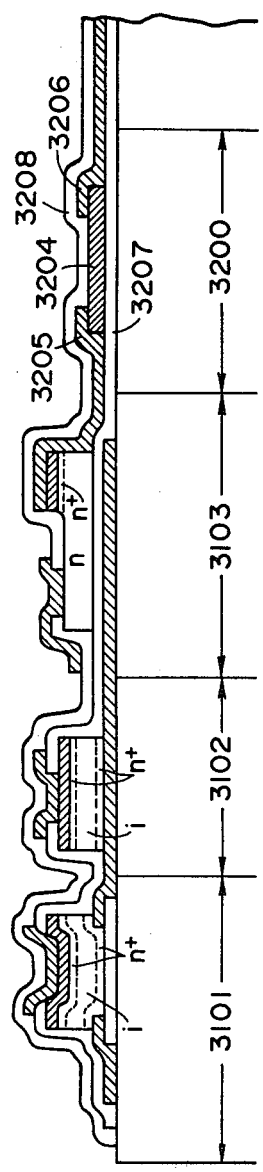

The photoelectric transducer illustrated in FIGS. 32A and B is a modification of the embodiment illustrated in FIGS. 31A and B. The modification is made by inserting the current feedback resistance $F_{1-0}$–$F_{54-31}$ as shown in FIG. 27. FIG. 32A is a schematic plane view and FIG. 32B is a cross sectional view taken along a line X—X' in FIG. 32A. Arrangement of the members in FIG. 32 is almost the same as that in FIG. 31. The difference is that resistance portion 3200 is provided, and the resistance portion may be produced by using an a-Si doped with an appropriate amount of dopant, or by using a metal oxide, a metal boride, a metal nitride or the like.

Resistance portion 3200 is composed of an insulating layer 3207, a resistive film having an appropriate resistivity 3204 on the insulating layer 3207, electrodes 3205 and 3206 disposed at the both sides of the resistive film 3204 and an insulating film 3208 at the surface portion.

Electrode 3205 is connected to the drain of the transistor at the amplifying portion 3203. FIGS. 33A and B illustrate an embodiment where an MIS transistor is used as a current feedback element and an MIS transistor is also used as an element for separation and these are fabricated by a thin film technique. FIG. 33A is a plane view while FIG. 33B is a cross sectional view taken along a line X—X' in FIG. 33A. Scanning circuit has been already explained in reference to FIG. 28A. This embodiment is different from that of FIG. 31 in point that a channel 3305 of MIS transistor 3300 as a selectable amplifying element is disposed in parallel with a light intercepting electrode 3306, and a transistor for separation 3206 and a transistor for current feedback 3307 are separately arranged.

The difference between the MIS transistor 3300 and the MIS transistor for amplification 612 (FIG. 6) resides in that the drain of MIS transistor 3300 is designed such that the drain has a resistive contact with an electrode metal. A gate of MIS transistor for separation 3306 is connected to a selection signal wire $b_i$, and the drain is connected to a transistor power source line $V_D$.

In the foregoing, embodiments of the present invention are explained by referring to a hybrid system where a-Si photoconductive element and crystal silicon integrated circuit and matrix wiring are arranged on a single substrate and a monolithic system where the above mentioned photoconductive element and scanning circuit are formed by using an a-Si or polycrystal thin film.

As mentioned above, according to the present invention, a photoelectric transducer scanning many light informations and putting out can be provided which is of a long length with a high accuracy and the noise often caused when a scanning circuit having an amplifying function is formed and photoconductive elements of high impedance are widely arranged is reduced to a great extent.

What we claim is:

1. A solid-state photoelectric transducer comprising a plurality of output units for photoelectrically converted signals, each unit including;
   a plurality of photoelectric converter elements;
   a plurality of signal accumulating means for accumulating signals output from said photoelectric converter elements corresponding to an amount of light incident on said photoelectric converter elements, each of said signal accumulating means being connected with a corresponding one of said photoelectric converter elements:
   a plurality of means for returning said signal accumulating means from a signal accumulating state to an initial state, each of said returning means being directly connected with a corresponding one of said signal accumulating means;
   a plurality of signal amplifying means for outputting amplified signals corresponding to the signals accumulated in said signal accumulating means, each of said signal amplifying means being connected with a corresponding one of said signal accumulating means;
and
   a plurality of cross-talk preventing means for preventing cross-talk of signals output from each of said signal amplifying means, each of said signal amplifying means being provided with one of said cross-talk preventing means;
   a plurality of said signal amplifying means being exclusively selected by a unit selecting signal for each of said output units, said output units having a controlling line which transmits a controlling signal for controlling each returning means in common, and said signal amplifying means of the same level in each of said output units having a signal output line in common.

2. A solid-state photoelectric transducer according to claim 1, in which said photoelectric converter element is a thin film semiconductor of silicon.

3. A solid-state photoelectric transducer according to claim 2, in which said thin film semiconductor of silicon is made of hydrogenated amorphous silicon.

4. A solid-state photoelectric transducer according to claim 2, in which said thin film semiconductor of silicon is made of polycrystalline silicon.

5. A solid-state photoelectric transducer according to claim 1, in which said signal amplifying means is a transistor.

6. A solid-state photoelectric transducer according to claim 5, in which said transistor is made of thin film silicon.

7. A solid-state photoelectric transducer according to claim 1, in which said returning means is a transistor.

8. A solid-state photoelectric transducer according to claim 7, in which said transistor is made of thin film silicon.

9. A solid-state photoelectric transducer comprising a plurality of output units for photoelectrically converted signals, each unit comprising:
   a plurality of photoelectric converter elements;
   a plurality of signal accumulating means for accumulating signals output from said photoelectric converter elements corresponding to an amount of light incident on said photoelectric converter elements, each of said signal accumulating means being connected with a corresponding one of said photoelectric converter elements;
   a plurality of means for returning said signal accumulating means from a signal accumulating state to an initial state, each of said means for returning to the initial state being connected with one of said signal accumulating means;
   a plurality of signal amplifying means for outputting amplified signals corresponding to the signals accumulated in said signal accumulating means, each of said signal amplifying means being connected with a corresponding one of said signal accumulating means;
   a plurality of cross-talk preventing means for preventing cross-talk of signal output from each of said signal amplifying means, each of signal amplifying means being provided with one of said cross-talk preventing means; and
   a plurality of standardizing means for mutually standardizing the operation characteristics of each of said signal amplifying means;
   a plurality of said signal amplifying means being exclusively selected by a unit selecting signal for each unit of said output units, said output units having a controlling line which transmits a controlling signal for controlling each returning means in common, and said signal amplifying means of the same level in each of said output units having a signal output line in common.

10. A solid-state photoelectric transducer according to claim 9, in which said photoelectric converter element is a thin film semiconductor of silicon.

11. A solid-state photoelectric transducer according to claim 10, in which said thin film semiconductor of silicon is made of hydrogenated amorphous silicon.

12. A solid-state photoelectric transducer according to claim 10, in which said thin film semiconductor of silicon is made of polycrystalline silicon.

13. A solid-state photoelectric transducer according to claim 9, in which said signal amplifying means is a transistor.

14. A solid-state photoelectric transducer according to claim 13, in which said transistor is made of thin film silicon.

15. A solid-state photoelectric transducer according to claim 9, in which said means for returning to the initial state is a transistor.

16. A solid-state photoelectric transducer according to claim 15, in which said transistor is made of thin film silicon.

17. A solid-state photoelectric transducer according to claim 9, in which said standardizing means is a resistance member.

18. A solid-state photoelectric transducer according to claim 9, in which said standardizing means is a transistor.

19. A solid-state photoelectric transducer according to claim 18, in which said transistor is made of thin film silicon.

20. A solid-state photoelectric transducer comprising a plurality of output units for photoelectrically converted signals, each unit including:
  a plurality of photoelectric converter elements;
  a plurality of signal accumulating means for accumulating signals output from said photoelectric converter elements corresponding to an amount of light incident on said photoelectric converter elements, each of said signal accumulating means being connected with a corresponding one of said photoelectric converter elements;
  a plurality of means for returning said signal accumulating means from a signal accumulating state to an initial state, each of said returning means being connected with a corresponding one of said signal accumulating means;
  a plurality of signal amplifying means for outputting amplified signals corresponding to the signals accumulated in said signal accumulating means, each of said signal amplifying means being connected with a corresponding one of said signal accumulating means; and
  a plurality of cross-talk preventing means for preventing cross-talk of signals output from each of said signal amplifying means, each of said signal amplifying means being provided with one of said cross-talk preventing means;
  a plurality of said signal amplifying means being exclusively selected by a unit selecting signal in each of said output units, and said signal amplifying means of the same level in each of said output units having a signal output line in common.

21. A solid-state photoelectric transducer according to claim 20, in which said photoelectric converting element is a photodiode.

22. A solid-state photoelectric transducer according to claim 20, in which said photoelectric converter element is a thin film semiconductor of silicon.

23. A solid-state photoelectric transducer according to claim 22, in which said thin film semiconductor of silicon is made of hydrogenated amorphous silicon.

24. A solid-state photoelectric transducer according to claim 22, in which said thin film semiconductor of silicon is made of polycrystalline silicon.

25. A solid-state photoelectric transducer according to claim 20, in which said signal amplifying means is a transistor.

26. A solid-state photoelectric transducer according to claim 25, in which said transistor is made of thin film silicon.

27. A solid-state photoelectric transducer comprising a plurality of output units for photoelectrically converted signals, each unit including:
  a plurality of photoelectric converter elements;
  a plurality of signal accumulating means for accumulating signals output from said photoelectric converter elements corresponding to an amount of light incident on said photoelectric converter elements, each of said signal accumulating means being connected with a corresponding one of said photoelectric converter elements;
  a plurality of signal amplifying means for outputting amplified signals corresponding to the signals accumulated in signal accumulating means, each of said signal amplifying means being connected with a corresponding one of said signal accumulating means;
  a plurality of cross-talk preventing means for preventing cross-talk of signal output from each of said signal amplifying means, each of said signal amplifying means being provided with one of said cross-talk preventing means; and
  a plurality of standardizing means for mutually standardizing the operation characteristics of each of said signal amplifying means;
  a plurality of said signal amplifying means being exclusively selected by a unit selecting signal in each of said output units, said output units having a controlling line which transmits a controlling signal for controlling each returning means in common, and said signal amplifying means of the same level in each of said output units having a signal output line in common.

28. A solid-state photoelectric transducer according to claim 27, in which said photoelectric converter element is a thin film semiconductor of silicon.

29. A solid-state photoelectric transducer according to claim 28, in which said thin film semiconductor of silicon is made of hydrogenated amorphous silicon.

30. A solid-state photoelectric transducer according to claim 28, in which said thin film semiconductor of silicon is made of polycrystalline silicon.

31. A solid-state photoelectric transducer according to claim 27, in which said signal amplifying means is a transistor.

32. A solid-state photoelectric transducer according to claim 31, in which said transistor is made of thin film silicon.

33. A solid-state photoelectric transducer according to claim 27, in which said standardizing means is a resistance member.

34. A solid-state photoelectric transducer according to claim 27, in which said standardizing means is a transistor.

35. A solid-state photoelectric transducer according to claim 34, in which said transistor is made of thin film silicon.

36. A solid-state photoelectric transducer comprising a plurality of output units for photoelectrically converted signals, each unit including:
  a plurality of photoelectric converter elements;
  a plurality of signal amplifying means for outputting amplified signals corresponding to signals output from said photoelectric converter elements corresponding to an amount of light incident on said photoelectric converter elements, each of said signal amplifying means being connected with a corresponding one of said photoelectric converter elements;
  a plurality of cross-talk preventing means for preventing cross-talk of signals output from each of said signal amplifying means, each of said signal amplifying means being provided with one of said cross-talk preventing means; and
  compensation means for compensating the environmental characteristics of the photoelectric converter elements in the output unit;
  a plurality of said signal amplifying means being exclusively selected by a unit selecting signal in each of said output units, and said signal amplifying means of the same level in each of said output units having a signal output line in common.

37. A solid-state photoelectric transducer according to claim 36, in which said photoelectric converter element is a thin film semiconductor of silicon.

38. A solid-state photoelectric transducer according to claim 37, in which said thin film semiconductor of silicon is made of hydrogenated amorphous silicon.

39. A solid-state photoelectric transducer according to claim 37, in which said thin film semiconductor of silicon is made of polycrystalline silicon.

40. A solid-state photoelectric transducer according to claim 36, in which said signal amplifying means is a transistor.

41. A solid-state photoelectric transducer according to claim 40, in which said transistor is made of thin film silicon.

42. A solid-state photoelectric transducer according to claim 36, in which said compensation means is a photoelectric converter element intercepted from outer light.

43. A solid-state photoelectric transducer according to claim 42, in which said photoelectric converter element is constituted of thin film semiconductor of silicon.

44. A solid-state photoelectric transducer according to claim 43, in which said thin film semiconductor of silicon is made of hydrogenated amorphous silicon.

45. A solid-state photoelectric transducer according to claim 43, in which said thin film semiconductor of silicon is made of polycrystalline silicon.

46. A solid-state photoelectric transducer comprising a plurality of output units for photoelectrically converted signals, each unit including:

a plurality of photoelectric converter elements;

a plurality of signal amplifying means for outputting amplified signals corresponding to signals output from said photoelectric converter elements corresponding to an amount of light incident on said photoelectric converter elements, each of said signal amplifying means being connected with a corresponding one of said photoelectric converter elements;

a plurality of cross-talk preventing means for preventing cross-talk of signals output from each of said signal amplifying means, each of said signal amplifying means being providing with one of said cross-talk preventing means;

a plurality of standardizing means for mutually standardizing the operation characteristics of each of said signal amplifying means among said signal amplifying means; and compensation means for compensating the environmental characteristics of the photoelectric converting elements in the output unit;

a plurality of said signal amplifying means being exclusively selected by a unit selecting signal in each of said output units, and said signal amplifying means of the same level in each of said output units having a signal output line in common.

47. A solid-state photoelectric transducer according to claim 46, in which said photoelectric converter element is a thin film semiconductor of silicon.

48. A solid-state photoelectric transducer according to claim 47, in which said thin film semiconductor of silicon is made of hydrogenated amorphous silicon.

49. A solid-state photoelectric transducer according to claim 47, in which said thin film semiconductor of silicon is made of polycrystalline silicon.

50. A solid-state photoelectric transducer according to claim 46, in which said signal amplifying means is a transistor.

51. A solid-state photoelectric transducer according to claim 50, in which said transistor is made of thin film silicon.

52. A solid-state photoelectric transducer according to claim 46, in which said compensation means is a photoelectric converter element intercepted from outer light.

53. A solid-state photoelectric transducer according to claim 52, in which said photoelectric converter element is a thin film semiconductor of silicon.

54. A solid-state photoelectric transducer according to claim 53, in which said thin film semiconductor of silicon is made of hydrogenated amorphous silicon.

55. A solid-state photoelectric transducer according to claim 53, in which said thin film semiconductor of silicon is made of polycrystalline silicon.

56. A solid-state photoelectric transducer according to claim 46, in which said standardizing means is a resistance member.

57. A solid-state photoelectric transducer according to claim 46, in which said standardizing means is a transistor.

58. A solid-state photoelectric transducer according to claim 57, in which said transistor is made of thin film silicon.

* * * * *

UNITED STATES PATENT AND TRADEMARK OFFICE
CERTIFICATE OF CORRECTION

PATENT NO. : 4,390,791

DATED : June 28, 1983

INVENTOR(S) : KATSUNORI HATANAKA, ET AL.

It is certified that error appears in the above-identified patent and that said Letters Patent is hereby corrected as shown below:

Column 4, line 67, "signaamplified signals" should read --signal amplifying means for outputting amplifier signals--.

Column 5, line 15, insert --unit-- between "a" and "selecting"; delete "unit" after "each";
        line 24, "ofphotoelectric transdufers" should read --of photoelectric transducers--.

Column 5, line 37, delete "mutually" after "of"; insert --mutually-- after "for";
        line 39, delete "and";
        line 45, insert --unit-- between "a" and "selecting"; delete "unit" after "each".

Column 9, line 2, "ae" should read --are--.

Column 12, line 12, "embodiment" should read --embodiments--;
      line 55, "expained" should read --explained--.

Column 13, line 27, "matrial" should read --material--;
      line 41, "dopted" should read --doped--.

Column 14, line 26, "shows" should read --show--;
      line 29, "taken an" should read --taken along--;
      line 31, "discribed" should read --described--.

Column 15, line 15, "are" should read --is--.

UNITED STATES PATENT AND TRADEMARK OFFICE
CERTIFICATE OF CORRECTION

PATENT NO. : 4,390,791  Page 2 of 2
DATED : June 28, 1983
INVENTOR(S) : KATSUNORI HATANAKA, ET AL.

It is certified that error appears in the above-identified patent and that said Letters Patent is hereby corrected as shown below:

Column 16, line 5, "$P_{1-10}$" should read --$P_{1-0}$--;
line 34, "circuit" should read --circuits--;
line 45, delete "a"; delete "on".

Column 17, line 19, "$R_{1-10}$" should read --$R_{1-0}$--.

Column 19, line 11, insert --)-- after "below".

Column 21, line 23, Claim 1, ":" after "elements" should read --;--;
line 34, insert --and-- after "semicolon";
line 35, delete "and".

Column 25, line 45, Claim 46, "providing" should read --provided--.

Signed and Sealed this

Seventeenth Day of April 1984

[SEAL]

Attest:

GERALD J. MOSSINGHOFF

Attesting Officer   Commissioner of Patents and Trademarks